US006525467B1

(12) United States Patent
Eida et al.

(10) Patent No.: US 6,525,467 B1
(45) Date of Patent: Feb. 25, 2003

(54) ORGANIC ELECTROLUMINESCENCE DISPLAY DEVICE AND METHOD OF PRODUCING THE SAME

(75) Inventors: Mitsuru Eida, Sodegaura (JP); Kenichi Fukuoka, Sodegaura (JP)

(73) Assignee: Idemitsu Kosan Co., Ltd. (JP)

( * ) Notice: Subject to any disclaimer, the term of this patent is extended or adjusted under 35 U.S.C. 154(b) by 0 days.

(21) Appl. No.: 09/937,614

(22) PCT Filed: Mar. 30, 2000

(86) PCT No.: PCT/JP00/02037
§ 371 (c)(1),
(2), (4) Date: Sep. 27, 2001

(87) PCT Pub. No.: WO00/60907
PCT Pub. Date: Oct. 12, 2001

(30) Foreign Application Priority Data

Apr. 2, 1999 (JP) .............................................. 11-96947

(51) Int. Cl.[7] .............................................. H05B 33/02
(52) U.S. Cl. ....................................... 313/506; 313/504
(58) Field of Search ................................ 313/498, 504, 313/505, 506, 509

(56) References Cited

U.S. PATENT DOCUMENTS 6,023,073 A * 2/2000 Strite ........................... 257/40
6,140,766 A * 10/2000 Okada et al. ............... 313/506
6,157,127 A * 12/2000 Hosokawa et al. ......... 313/506

FOREIGN PATENT DOCUMENTS

| JP | 2-230693 | 9/1990 |
| JP | 9-106887 | 4/1997 |
| JP | 10-208883 | 8/1998 |
| JP | 10-223375 | 8/1998 |
| JP | 11-31590 | 2/1999 |
| JP | 11-195492 | 7/1999 |
| JP | 2000-91083 | 3/2000 |
| WO | WO97/34447 | 9/1997 |

* cited by examiner

*Primary Examiner*—Ashok Patel
*Assistant Examiner*—Thelma Sheree Clove
(74) *Attorney, Agent, or Firm*—Parkhurst & Wendel, L.L.

(57) ABSTRACT

An organic EL display device having a large luminescence pixel area and a production method efficiently providing such organic EL display device. An organic electroluminescence display device having a substrate on which are successively provided a lower electrode having an auxiliary wiring layer electrically connected thereto, an organic luminescent medium, and an opposed electrode, the lower electrode and the opposed electrode being disposed in an XY matrix, wherein the auxiliary wiring layer and the lower electrode are wired on different surfaces and electrically connected in a nonluminescent portion, or are wired on the same surface and electrically connected in a nonluminescent portion and an electric insulation layer is provided in a portion, excluding the electrical connection, between the auxiliary wiring layer and the lower electrode.

18 Claims, 19 Drawing Sheets

PRIOR ART

ORGANIC ELECTROLUMINESCENCE DISPLAY DEVICE AND METHOD OF PRODUCING THE SAME

TECHNICAL FIELD

The present invention relates to an organic electroluminescence display device (which may be referred to as an organic EL display device), and a method of producing the same.

More specifically, the present invention relates to an organic EL display device having a large luminescence pixel area to be suitable for display devices (displays) for the personal use and industrial use; and a production method making it possible to obtain such an organic EL display device effectively.

BACKGROUND ART

Conventionally, there have been suggested EL display devices wherein EL elements, each of which is composed of a luminescent layer sandwiched between electrodes, are driven (are caused to cause luminescence) through scanning electrode lines or signal electrode lines arranged in a matrix form. To make their luminescence pixels highly fine, it is required to prevent a voltage drop and a response delay based on the wiring resistance of the scanning electrode lines and the like.

As shown in FIG. 17, therefore, there is suggested an inorganic EL element comprising first transparent electrodes (lower electrodes) 102, an inorganic luminescent layer 104 and second electrodes (opposed electrodes) 105 which are successively deposited on a glass substrate 101, wherein auxiliary electrodes 103 for resistance-reduction and the first transparent electrodes 102 are electrically networked to each other on the same plane and they are electrically connected to each other in side ends of the first transparent electrodes 102 and non-luminescent portions.

One of EL elements having this type of auxiliary electrode is an EL element disclosed in Japanese Patent Application Laid-Open (JP-A) No. 1996-180974.

As shown in FIG. 18, JP-A No. 1999-31590 suggests an organic EL element wherein metal electrodes 203 are formed, in the vicinity (non-luminescent portions) of transparent electrodes 202 formed in a simple matrix form on a substrate 201, so as to overlap with four sides of the respective transparent electrodes 202 to connect them electrically, and the metal electrodes 203 are covered with an electric insulation layer 206, thereby suppressing the electric resistance of the transparent electrodes 202 by the metal electrodes 203.

On the other hand, as shown in FIG. 19, WO97/34447 discloses an organic EL element comprising a flattening layer 306, lower electrodes 302, an organic luminescent layer 304 and opposed electrodes 305 which are successively deposited on a supporting substrate 301, wherein an auxiliary wiring layer 303 which is electrically connected to the lower ends of the lower electrodes 302 is formed and the auxiliary wiring layer 303 is embedded in the flattening layer 306.

In the EL element shown in FIG. 17, however, the first transparent electrodes (lower electrodes) and the auxiliary electrodes are arranged on the same plane and they are electrically connected to each other in the state that they overlap with each other. Moreover, the luminescent layer is deposited directly on the transparent electrodes and the auxiliary electrodes. For these reasons, many level-differences, which result from the film thicknesses of the transparent electrodes and the auxiliary electrodes, are generated. Therefore, there arises a problem that crosstalk, which is a phenomenon of luminescence of pixels other than selected pixels, is caused by a short circuit between some opposed electrode and some lower electrode, or a problem that display defects, such as generation of a non-luminescence line, which is a phenomenon that light from selected pixels is not emitted by the snapping of the opposed electrode, are easily generated.

Since the transparent electrodes and the auxiliary electrodes are formed on the same plane, the sectional area of the auxiliary electrodes themselves is so small that sufficient measures cannot be taken for making the luminescence pixels highly fine. Particularly in the case that the luminescence pixels are made highly fine to make the electric resistance of the transparent electrodes to, for example, 1 k$\Omega$ or more, it is not easy to adjust the electric resistance of the transparent electrodes to a low value, for example, 100$\Omega$ or less by changing the width or the thickness of the auxiliary electrodes.

Furthermore, the transparent electrodes and the auxiliary electrodes are formed on the same plane. Therefore, if the transparent electrodes and the auxiliary electrodes are subjected to positional slippage, the transparent electrodes adjacent to the auxiliary electrode subjected to the positional slippage are short-circuited through this auxiliary electrode so that a display defect is generated. Thus, a problem that the yield in production is lowered arises.

In the case of the organic EL element shown in FIG. 18, the problem that the transparent electrodes are short-circuited by the positional slippage of the metal electrodes can be avoided since the metal electrodes are covered with the electric insulation layer. However, the metal electrodes wired on the same plane where the transparent electrodes are wired are formed to overlap with the edge sides of the transparent electrodes. Therefore, the level-differences resulting from the thicknesses or deposition heights of the transparent electrodes and the metal electrodes become more notable so that a short circuit is caused between some transparent electrode and some opposed electrode. Thus, there arises a problem that crosstalk and display defects such as generation of a non-luminescence line is more easily caused than the case of the EL element shown in FIG. 17.

Furthermore, in the case of this organic EL element, the metal electrodes are made, on the same plane where the transparent electrodes are made, so as to connect electrically only to the four sides of the transparent electrodes, which do not produce an effect on the luminescent area of the EL element. However, the transparent electrodes are covered with the metal electrodes. Therefore, if the sectional area of the metal electrodes is made large, a problem that the luminescent area is reduced is caused, resulting in a problem that a luminescent brightness cannot be sufficiently obtained if the luminescence pixels are made highly fine.

On the other hand, in the organic EL display device disclosed in the PCT WO97/3447 publication, the auxiliary wiring layer is embedded in the flattening layer or the like; therefore, the level-differences resulting from the thickness of the auxiliary wiring layer is not generated and the following advantages are produced: the yield in production is high, and crosstalk and display defects such as generation of a non-luminescence line are not caused very much. However, the electrical connection portion between the auxiliary wiring layer and the lower electrode is positioned at the side end of the lower electrode; therefore, it is difficult to make the sectional area of the auxiliary electrode large. If the sectional area is made large, a problem that the area of the luminescence pixels is reduced arises.

Thus, the inventors of the present invention made eager investigations on the above-described problems. As a result, the inventors have found that the problems in the prior art can be solved by wiring a part of the auxiliary wiring layer on a face different from the face on which the lower electrodes are wired and connecting the auxiliary wiring layer electrically in non-luminescent portions in the organic EL display device, or by arranging an electric insulation layer between the lower electrodes and the auxiliary wiring layer and thus connecting the auxiliary wiring layer electrically in non-luminescent portions even if the auxiliary wireing layer and the lower electrodes are wired on the same plane.

That is, an object of the present invention is to provide an organic EL display device which has a luminescence pixel area and a high luminescent brightness, and makes it possible to exclude bad effects, such as generation of display defects based on the thickness of an auxiliary wiring layer, and to make the sectional area of the auxiliary wiring layer large.

Another object of the present invention is to provide a production method making it possible to produce, with a high yield, an organic EL display device which has a large luminescence pixel area and which excludes bad effects, such as generation of display defects based on the thickness of an auxiliary wiring layer.

DISCLOSURE OF THE INVENTION

[1] One aspect (first invention) of the present invention is an organic EL display device having a supporting substrate on which lower electrodes electrically connected to auxiliary wiring layers, an organic luminescent medium, and opposed electrodes are successively disposed, wherein the lower electrodes and the opposed electrodes are disposed in a XY matrix, characterized in that the auxiliary wiring layers and the lower electrodes are wired in different planes, and the auxiliary wiring layers are electrically connected to the lower electrodes in non-luminescent portions of the organic EL display device.

By constituting the device in this way, the electric connecting parts do not overlap with luminescent portions. Therefore, the light quantity taken out from the lower electrode side can be made large so that the value of the luminescent brightness of the organic EL display device can be made large.

Since the auxiliary wiring layers and the lower electrodes are wired in the planes different from each other in the perpendicular direction, flattening can easily be attained so that bad effects, such as generation of a short circuit resulting from the film thickness of the auxiliary wiring layers, can be removed.

Furthermore, since problems of a short circuit between the lower electrodes adjacent to each other or between the lower electrodes and the opposed electrodes are not caused, the thickness or the width of the auxiliary wiring layers can be made so large that the sectional area thereof can be made large. The driving voltage (power consumption) of the organic EL display device can be made small, and crosstalk and display defects such as generation of non-luminescence lines can be reduced.

[2] At the time of constituting the organic EL display device of the first invention, it is preferred that an electric insulation layer is disposed between the auxiliary wiring layers and the lower electrodes.

By constituting the device in this way, the auxiliary wiring layers can be embedded in the electric insulation layer. Therefore, even if the auxiliary wiring layers are disposed, the surface can be flattened. Consequently, electric insulation between the lower electrodes adjacent to each other or between the lower electrodes and the opposed electrodes can be surely kept.

[3] At the time of constituting the organic EL display device of the first invention, it is preferred that the auxiliary wiring layers are electrically connected to the lower electrodes through via holes made in the non-luminescent portions of the organic EL display device.

By constituting the device in this way, the snapping of the lower electrodes, resulting from difference in the thickness of the auxiliary wiring layers, is decreased so that the auxiliary wiring layers can be surely connected electrically to the lower electrodes.

[4] Another aspect (second invention) of the present invention is an organic EL display device having a supporting substrate on which lower electrodes electrically connected to auxiliary wiring layers, an organic luminescent medium, and opposed electrodes are successively disposed, wherein the lower electrodes and the opposed electrodes are disposed in a XY matrix, wherein the auxiliary wiring layers and the lower electrodes are wired in the same plane, the auxiliary wiring layers are electrically connected to the lower electrodes in non-luminescent portions by electric connecting parts provided therein, and an electric insulation layer is disposed between the auxiliary wiring layers and the lower electrodes, except the electric connecting parts.

By constituting the device in this way, the electric connecting portions of the auxiliary wiring layers and the lower electrodes do not overlap with luminescent portions. Therefore, the light quantity taken out from the lower electrode side can be made large so that the value of the luminescent brightness of the organic EL display device can be made large.

Since the electric insulation layer is formed between the lower electrodes and the auxiliary wiring layers, which are wired in the same plane, except the electric connecting parts, the level-differences resulting from the thicknesses of the lower electrodes and the auxiliary wiring layers are cancelled by the electric insulation layer so as not to cause any short-circuit between the opposed electrodes, and the lower electrodes and the auxiliary wiring layers, or the snapping of the opposed electrodes. Consequently, crosstalk and display defects such as generation of non-luminescence lines can be reduced.

[5] At the time of constituting the organic EL display devices of the first and second inventions, it is preferred that the surface of the electric insulation layer is flattened.

By constituting the devices in this way, the thickness of the auxiliary wiring layer causes no trouble so that the yield in production is improved and crosstalk and display defects such as generation of non-luminescence lines can be more reduced.

[6] At the time of constituting the organic EL display devices of the first and second inventions, it is preferred that side surfaces of the via holes for connecting the auxiliary wiring layers and the lower electrodes are made into a forward-tapered form.

By constituting the devices in this way, the snapping of the lower electrodes by the edge of the electric insulation layer is decreased. Thus, the lower electrodes can be surely connected electrically to the auxiliary wiring layers. By constituting the device in this way, in the electric connecting parts of the auxiliary wiring layers and the lower electrodes, the contact area therebetween can be made large because of wide apertures. Thus, the adhesiveness therebetween can be made high. Furthermore, a conductive material or the like can easily be filled into the via holes from their wide apertures. Thus, the production also becomes easy.

[7] At the time of constituting the organic EL display devices of the first and second inventions, it is preferred that the lower electrodes are extended into the via holes for the electrical connection.

For example, if the same conductive material as for the lower electrodes or the auxiliary wiring layers is filled into the via holes and the lower electrodes are extended, the electrical connection between the lower electrodes and the auxiliary wiring layers is made surer.

[8] A further aspect (third invention) of the present invention is a method of producing an organic EL display device having a supporting substrate on which lower electrodes electrically connected to an auxiliary wiring layers, an organic luminescent medium, and opposed electrodes are successively disposed wherein the lower electrodes and the opposed electrodes are disposed in a XY matrix, the method of an organic EL display device comprising the steps of:

wiring the auxiliary wiring layer and the lower electrodes in planes which are partially different; and connecting the auxiliary wiring layers electrically to the lower electrodes in non-luminescent portions.

By carrying out the invention in this way, the electrically connecting portions of the auxiliary wiring layers and the lower electrodes can easily be disposed in other than the luminescent portions of the organic EL display device. Since the auxiliary wiring layers and the lower electrodes are wired in the planes different from each other in the perpendicular direction, flattening can easily be attained. Moreover, the sectional area of the auxiliary wiring layer can be made large; therefore, driving voltage (power consumption) of the organic EL display device can be made small and further crosstalk and display defects such as generation of non-luminescence lines can be more reduced.

[9] At the time of carrying out the method of producing the organic EL display device of the third invention, it is preferred that the invention comprises the step of disposing an electric insulation layer between the lower electrodes and the auxiliary wiring layers.

By carrying out the invention in this way, the auxiliary wiring layers can be embedded in the electric insulation layer to be made flat, and the electric insulation between the auxiliary wiring layers and the lower electrodes adjacent thereto can be surely kept.

[10] At the time of carrying out the method of producing the organic EL display device of the third invention, it is preferred that the invention comprises the steps of forming via holes in the non-luminescent portions; and connecting the auxiliary wiring layers electrically to the lower electrodes through the via holes.

By carrying out the invention in this way, the snapping of the lower electrodes, resulting from difference in the thickness of the auxiliary wiring layers, is not caused so that the auxiliary wiring layers can be surely connected electrically to the lower electrodes.

[11] A still further aspect (fourth invention) of the present invention is a method of producing an organic EL display device having a supporting substrate on which lower electrodes electrically connected to auxiliary wiring layers, an organic luminescent medium, and opposed electrodes are successively disposed wherein the lower electrodes and the opposed electrodes are disposed in a XY matrix, the method of producing an organic EL display device comprising the steps of:

wiring the auxiliary wiring layers and the lower electrodes in the same plane;

forming electrical connecting parts in non-luminescent portions to connect the auxiliary wiring layers electrically to the lower electrodes; and disposing an electric insulation layer between the auxiliary wiring layers and the lower electrodes, except the electrical connecting parts.

By carrying out the invention in this way, the electrical connecting parts of the auxiliary wiring layers and the lower electrodes can easily be disposed in other than the luminescent portions. Since the electric insulation layer is disposed between the lower electrodes and the auxiliary wiring layer, the electric insulation between the auxiliary wiring layers and the opposed electrodes can be surely kept even if the auxiliary wiring layers and the lower electrodes are wired in the same plane. By carrying out the invention in this way, the level-differences resulting from the thicknesses of the lower electrodes and the auxiliary wiring layers are cancelled by the electric insulation layer, so as to attain flattening. Therefore, the sectional area of the auxiliary wiring layers can also be made large, so that crosstalk and display defects such as generation of non-luminescence lines can be reduced.

[12] At the time of carrying out the methods of producing the organic EL display device of the third and fourth inventions, it is preferred that the inventions comprise the step of flattening the surface of the electric insulation layer.

By carrying out the inventions in this way, the thickness of the auxiliary wiring layers causes no trouble so that the yield in production is improved and crosstalk and display defects such as generation of non-luminescence lines can be more reduced.

[13] At the time of carrying out the methods of producing the organic EL display device of the third and fourth inventions, it is preferred that the inventions comprise the step of making a side surface of the via holes into a forward-tapered form.

By carrying out the inventions in this way, the snapping of the lower electrodes by the edge of the electric insulation layer is more reduced. Moreover, by carrying out the inventions in this way, vacuum deposition or the like is used to fill a conductive material easily into the via holes.

[14] At the time of carrying out the methods of producing the organic EL display device of the third and fourth inventions, it is preferred that the inventions comprise the step of extending the lower electrodes into the via holes to connect the lower electrodes electrically to the auxiliary wiring layers.

For example, if the same conductive material as for the lower electrodes or the auxiliary wiring layers is filled into the via holes to extend the lower electrodes, the snapping of the lower electrodes is more decreased so that electrical connection between the lower electrodes and the auxiliary wiring layers is made surer. As a result, the yield in production can be improved.

BRIEF DESCRIPTION OF DRAWINGS

FIG. 1(a) is a top view, FIG. 1(b) is a sectional view taken along X-X line, and FIG. 1(c) is a sectional view taken along Y-Y line.

FIG. 3(a) is a top view, FIG. 3(b) is a sectional view taken along X-X line, and FIG. 3(c) is a sectional view taken along Y-Y line.

FIG. 5(a) is a sectional view of non-luminescent portions and FIG. 5(b) is a sectional view of luminescence portions.

FIG. 6(a) is a sectional view of non-luminescent portions, and FIG. 6(b) is sectional view of luminescence portions.

FIG. 7(a) is a sectional view of non-luminescent portions, and FIG. 7(b) is a sectional view of luminescence portions.

FIG. 8(a) is a top view, and FIG. 8(b) is a sectional view taken along X-X line.

FIGS. 13(e) and 13(b) are outline-explaining views, each of which shows the organic EL display device in a lower electrode forming step of the production process in the third embodiment. FIG. 13(b) is a sectional view taken along X-X line.

FIG. 15(a) is a top view, and FIG. 15(b) is a sectional view taken along X-X line.

FIG. 17 is an outline-explaining view which schematically shows an EL element having conventional auxiliary electrodes.

BEST MODE FOR CARRYING OUT THE INVENTION

Figure 1A:
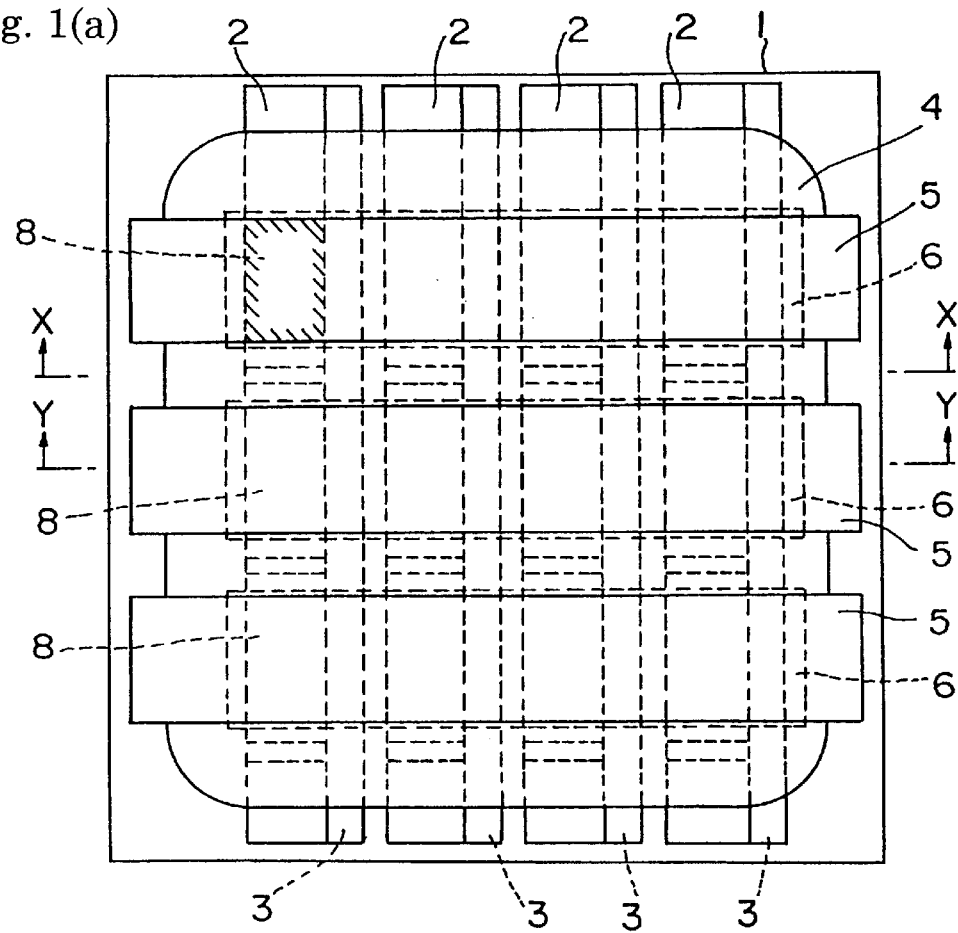
FIGS. 1(a), 1(b) and 1(c) are outline-explaining views, each of which schematically shows an organic EL display device in a first embodiment.

Hereinafter, referring to the drawings, embodiments of the present invention will be specifically described. The drawings to which will be referred merely shows the outline of the size, shape and arrangement relationship of respective constituting members to the degree that this invention can be understood. Therefore, this invention is not limited to illustrated examples.

In the case that in the organic EL display device of the present invention lower electrodes, an organic luminescent medium, opposed electrodes and an electric insulation layer disposed on a supporting substrate are not particularly flattened, the surfaces of the respective layers may have smooth unevenness or uplifts. However, the respective layers may be appropriately shown in the state that they are flattened to make understanding from the drawings easy.

First Embodiment

Figure 1B:
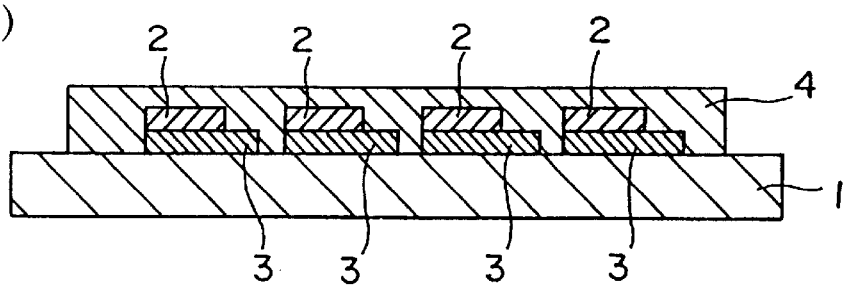
Figure 1C:
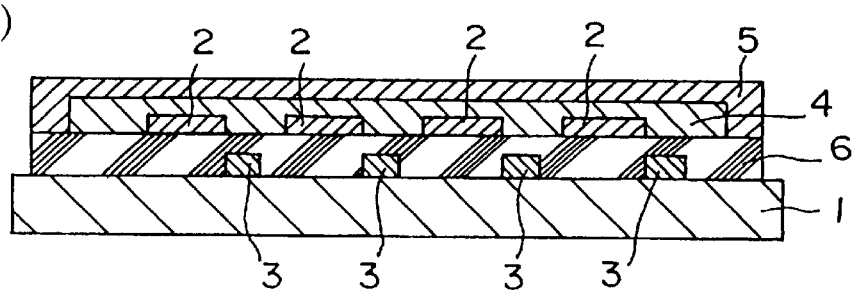

Referring to FIG. 1, the first embodiment of the organic EL display device of the present invention will be firstly described. FIGS. 1(a), 1(b) and 1(c) schematically show the first embodiment of the organic EL display device of the present invention. FIG. 1(a) is a top view, FIG. 1(b) is a sectional view taken along X-X line, and FIG. 1(c) is a sectional view taken along Y-Y line.

1. Basic Form

The organic EL display device of the present embodiment, shown in FIG. 1, is an organic EL display device having a supporting substrate 1 on which lower electrodes (transparent electrodes) 2, an organic layer comprising an organic luminescent layer (hereinafter, referred to an organic luminescent medium) 4, and opposed electrodes 5 which are deposited in this order. The lower electrodes 2 and the opposed electrodes 5 are disposed in a XY matrix. Respective portions where the lower electrodes 2 and the opposed electrodes 5 cross constitute luminescent portions (luminescence pixel portions) 8 of the organic EL display device.

An electric insulation layer 6 is disposed between the supporting substrate 1 and the lower electrodes 2 and in portions corresponding to the lower portions of the opposed electrodes 5 (see FIG. 1(c)). An auxiliary wiring layer 3 for reducing the electric resistance of the lower electrodes 2 is embedded and wired in the electric insulation layer 6.

The auxiliary wiring layer 3 in the present embodiment is embedded in the electric insulation layer 6, :so as to be partially wired in a plane which is different from the plane on which the lower electrodes 2 are disposed and be wired in non-luminescent portions in the manner that the layer 3 does not overlap with the luminescent portions (luminescence pixel portions) 8 of the organic EL display device. Moreover, the auxiliary wiring layer 3 is electrically connected to the lower electrodes 2 in the non-luminescent portions to reduce the electric resistance of the lower electrodes 2.

The luminescent portions (luminescence pixel portions) 8 are areas where the lower electrodes 2 and the opposed electrodes 5 cross and where holes or electrons can be injected into the organic luminescent medium 4. The non-luminescent portions are areas where the lower electrodes 2 and the opposed electrodes 5 do not cross, or areas where the lower electrodes 2 and the opposed electrodes 5 cross but holes or electrons cannot be injected into the organic luminescent medium 4.

Moreover, there is provided a auxiliary wiring layer 3 in the non-luminescence portions. That is, the layer 3 is wired in parallel to the lower electrodes 2 between the lower electrodes 2. In the lower portions of the opposed electrodes 5, the layer 3 is embedded in the electric insulation layer 6 (see FIG. 1(c)). And the layer 3 is extended from the wiring portions which are parallel to the lower electrodes 2 to spaces between the respective opposed electrodes 5. The layer 3 is electrically connected to the lower electrodes 2 in the spaces between the opposed electrodes 5 (see FIG. 1(b)).

Moreover, the electric insulation layer 6 is a flattened electric insulation layer which is formed between the supporting substrate 1 and the lower electrodes 2, and the layer 3 is embedded therein.

Figure 2:
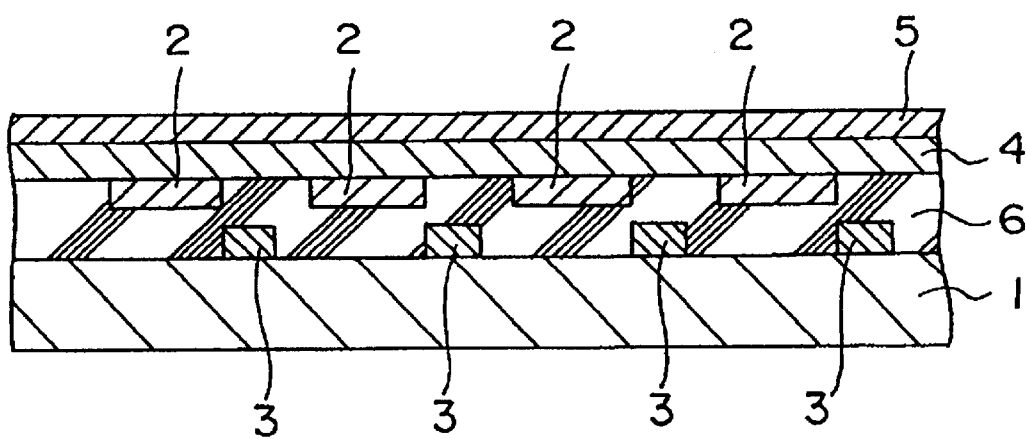
FIG. 2 is a sectional view of a luminescent portion, which shows another form of the organic EL display device in the first embodiment.

The electric insulation layer 6 may be not only in the form as shown in FIG. 1, but also in the form which the lower electrodes 2 are embedded in the surface and both of the lower electrodes 2 and the surface are flattened as shown in FIG. 2. By such a structure, the level-differences resulting from the thickness of the lower electrodes 2 are relieved because the lower electrodes 2 are also embedded in the electric insulation layer 6, and the snapping of the opposed electrodes 5 and a short-circuit between the lower electrodes 2 and the opposed electrodes 5 are not caused. In short, display defects such as disconnection and crosstalk can be reduced.

Figure 3A:
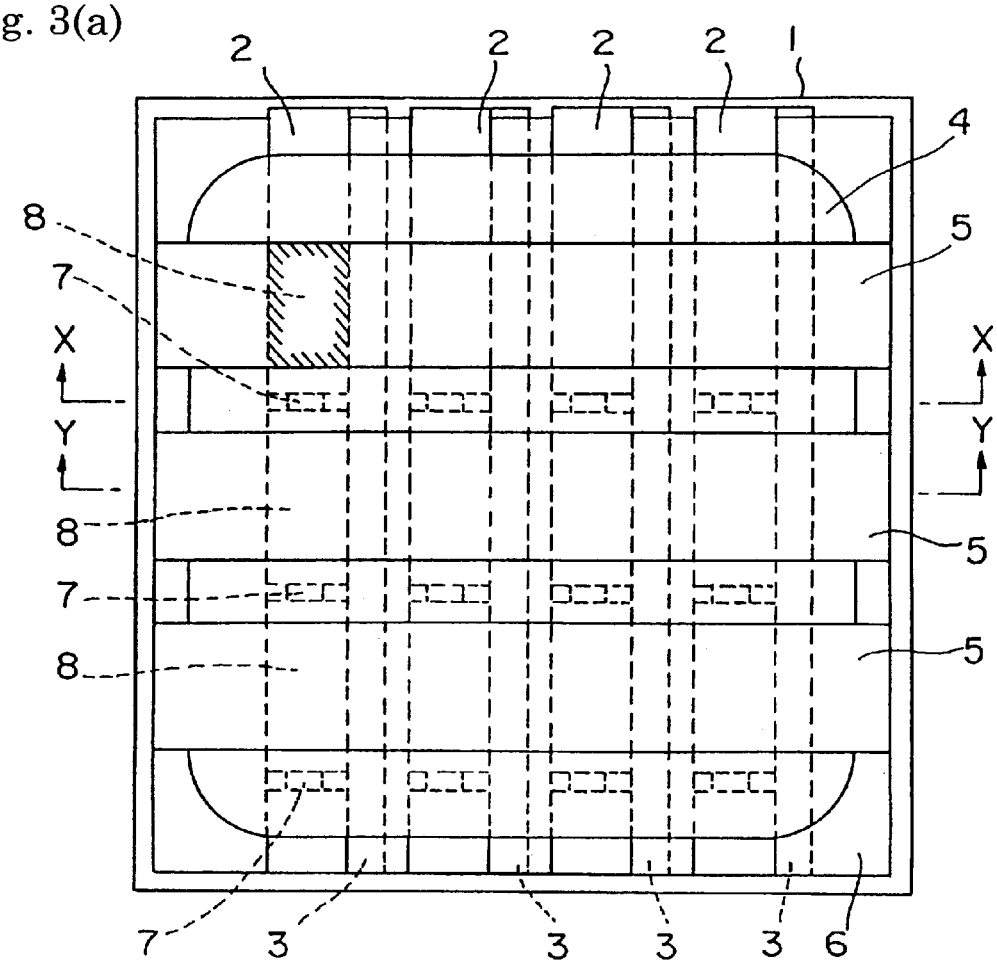
FIGS. 3(a), 3(b) and 3(c) are outline-explaining views, each of which schematically shows a further form of the organic EL display device in the first embodiment.
Figure 3B:
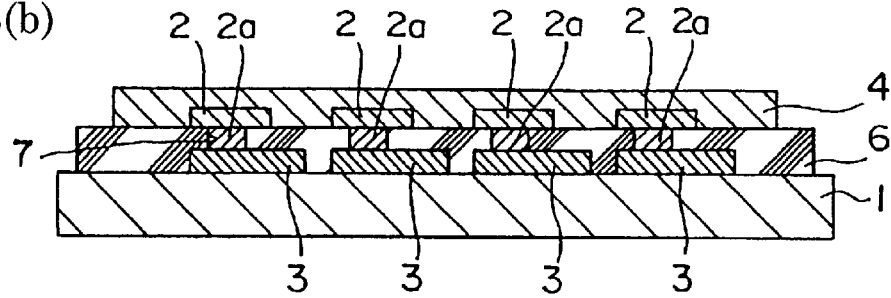
Figure 3C:
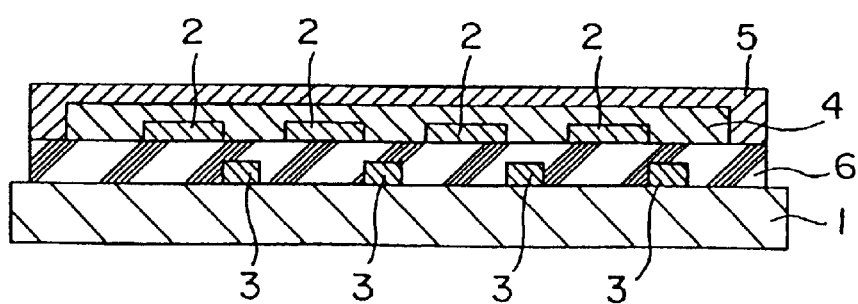

Furthermore, as shown in FIG. 3, as the form of the electric insulation layer 6, it is also preferred that a form in which the electric insulation layer 6 is formed over the entire face between the lower electrodes 2 and the auxiliary wiring layer 3 and the whole of the auxiliary wiring layer 3 is embedded in the electric insulation layer 6.

By this structure, the auxiliary wiring layer 3 is embedded in the electric insulation layer 6 so that all parts of the layer 3 are wired on a face different from the face on which the lower electrodes 2 are disposed.

In this case, the entire electric insulation layer 6 is present between the auxiliary wiring layer 3 and the lower electrodes 2. Therefore, in order to connect the auxiliary wiring layer 3 electrically to the lower electrodes 2, via holes 7 may be made in non-luminescent portions of the electric insulation layer 6, which do not overlap with the luminescence portions 8 of the organic EL display device. Accordingly, the auxiliary wiring layer 3 can be electrically connected to the lower electrodes 2 through the via holes 7 (see FIG. 3(b)).

By this structure, the electric resistance of the lower electrodes 2 can be effectively reduced in the same way as in the case shown in FIG. 1.

Moreover, as shown in FIG. 3, the via holes 7 made in the electric insulation layer 6 are opening portions for connecting the electric insulation layer 6 and the lower electrodes 2 positioned between the spaces of the opposed electrodes 5. Therefore, by arranging conductive portions 2a for making electrically conductive between the lower electrodes 2 and the auxiliary wiring layer 3 in the via holes 7, the lower electrodes 2 can be electrically connected to the auxiliary wiring layer 3.

Figure 4:
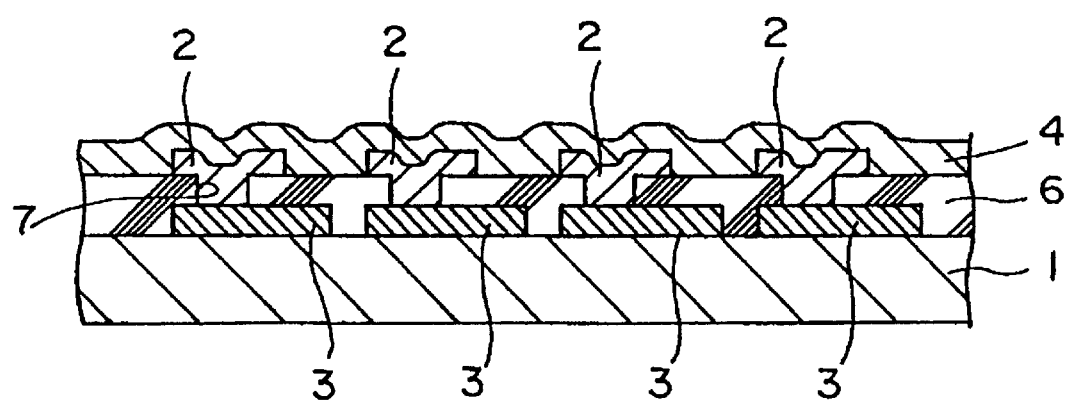
FIG. 4 is a sectional view of a non-luminescent portion, which shows a still another form of the organic EL display device in the first embodiment.

Moreover, the kind of the conductive portions 2a is not particularly limited if the kind makes it possible to connect the lower electrodes 2 electrically to the auxiliary wiring layer 3. The conductive portions 2a may be formed by filling a conductive member into through holes 7, for example, as shown in FIG. 3(b). As shown in FIG. 4, the lower electrodes 2 themselves may be made up to the conductive portions 2a by extending the lower face of the lower electrodes 2.

By forming the via holes 7 in this way, the generation of the snapping of the lower electrodes 2, based on a difference in the thickness of the auxiliary wiring layer 3, is reduced. Accordingly, the electrical connection of the lower electrodes 2 to the auxiliary wiring layer 3 can be surely attained. Thus, a brightness distribution in display areas becomes more uniform and further the yield in production can be made high.

According to the organic EL display device of the present embodiment having the above-described structure, the portions for connecting the auxiliary wiring layer 3 and the lower electrodes 2 electrically do not overlap with the luminescent portions 8 in the organic EL display device. Therefore, light quantity taken out from the lower electrode side can be made large so that the luminescent brightness value of the organic EL display device can be increased.

Since the electric insulation layer 6 is disposed between the auxiliary wiring layer 3 and the lower electrodes 2, the auxiliary wiring layer 3 can be embedded in the electric insulation layer 6. Therefore, the auxiliary wiring layer 3 and the lower electrodes 2 have portions wired on faces different from each other in a vertical direction, so that the auxiliary wiring layer 3 does not project over the lower electrodes 2. Thus, the respective layers of the device can easily be made flat. By such a structure, the film thickness of the auxiliary wiring layer 3 does not cause problems.

Thus, by such a structure, the yield in production is improved and crosstalk and display defects such as generation of a non-luminescence line can be still more reduced.

Furthermore, by disposing the electric insulation layer 6 in which the auxiliary wiring layer 3 is embedded, the electric insulation between the lower electrodes 2 and the auxiliary wiring layer 3 adjacent thereto or between the lower electrodes 2 can be sufficiently kept so that no short circuit is caused. The sectional area of the auxiliary wiring layer 3 can also be increased.

2. Constituting Elements

Hereinafter, each of constituting elements of the organic EL display device of the present embodiment will be specifically described.

(1) Lower electrodes

In the present embodiment, the lower electrodes are electrically connected to the auxiliary wiring layer. Since a material having a high electric conductivity, that is, a low-resistance material is used in the auxiliary wiring layer, it is not essential to use a material having a high electric conductivity in the lower electrode layer. In the case that light is taken out from the lower electrode side, it is preferred to use a conductive material having a light transmissivity of 30% or more at a luminescent wavelength.

Moreover, the lower electrode layer turns to anodes or cathodes, dependently on the structure of the organic EL display device. In the case that the lower electrode layer turns to anodes, it is preferred to use a conductive material, such as a metal having a high work function (work function 4.0 eV or more), which is superior in hole injecting ability. In the anodes, the electric resistance thereof is not considered. Therefore, a semiconductor may be used. Specifically, for example, it is preferred to use a metal such as gold (Au), nickel (Ni), palladium (Pd) and platinum (Pt), a conductive oxide such as In—Sn—O, ZnO:Al (a mixture wherein Al is added to ZnO), In—Zn—O, SnO$_2$:Sb (a mixture wherein Sb is added to SnO$_2$), and a semiconductor such as α-silicon, polysilicone, α-silicon carbide and α-carbon. Furthermore, a conjugated polymer which is an organic semiconductor may be used. Specifically, it is preferred to use polyaniline, polyarylenevinylene, polythiophenylenevinylene, polyacetylene, polypyrrole or the like.

On the other hand, in the case that the lower electrode layer turns to cathodes, it is preferred to use a conductive material, such as a metal or alloy having a low work function (work function 4.0 eV or less), which is superior in electron injecting ability. In the cathodes, the resistivity thereof is not considered. Therefore, a semiconductor may be used.

Moreover, it is preferred to use, as the alloy used in the cathodes, an alloy containing a very small amount of an alkali earth metal, an alkali metal or a rare earth metal, for example, Al—Li, Al—Mg, Al—Ba, Al—Ca, Al—Sc and Al—Yb and the like. Furthermore, it is also possible to use, as the cathodes, a super-thin film (about 20 nm or less) of an alkali earth metal oxide such as BaO, SrO and MgO. It is also preferred to use, as a material constituting the cathodes, a metal boride or a metal nitride having a low work function, such as LaB$_6$ or TiN, or a rare earth metal silicide having a low work function, or a mixture of an organic luminescent medium and the above-described metal.

Since the lower electrode layer may have a high resistivity in the present embodiment, the film thickness thereof can be made thin. In this case, the film thickness is preferably set to a value of 300 nm or less, and particularly it is preferred to set to a value within the range of 2 to 200 nm. In this case, within the range of the film thickness of 2 to 10 nm, a continuous layer may not be formed. However, in the case that the lower electrode layer is adhered closely to the auxiliary wiring layer in wide areas, it has been recognized that no trouble arises in operation of the organic EL element.

On the other hand, if the film thickness is over 300 nm, the snapping of the opposed electrodes may be caused in edge portions of the lower electrode layer or a short circuit may be caused between the lower electrode layer and the opposed electrodes.

In the present embodiment, the lower electrodes can be formed by known methods. For example, the lower electrodes are formed by forming a film by sputtering method, and then patterning the film by photolithography method.

(2) Auxiliary Wiring Layer

In the present embodiment, the auxiliary wiring layers have a function of auxiliary electric wires for reducing the electric resistance of the lower electrodes. Therefore, it is necessary that they have a low resistance and are electrically connected to the lower electrodes.

The electrical connection means that when a power source is connected to the auxiliary wiring layer and the opposed electrodes, the auxiliary wiring layer is connected to the lower electrodes to apply a voltage to the organic EL display device. Therefore, the auxiliary wiring layer is a layer through which electric current supplied to the organic EL display device passes, and preferably have a low resistance. That is to say, when the organic EL display device has such an auxiliary wiring layer, the resistance of the lower electrode layer can be made very low.

Moreover, the auxiliary wiring layer used in the present embodiment is not particularly limited if they have a low resistance. However, for example, it is preferably such a metal line that makes the resistance of electrode lines (for example, signal electrode lines) to 5 kΩ or less.

The reason for this is that if the resistance of the electrode lines combined with the auxiliary wiring layer is over 5 kΩ, unevenness of luminescent brightness of the pixels or unevenness of luminescent brightness of the organic EL display device may be generated.

In the case of displaying television images, it is more preferred to combine the electrode lines with the auxiliary wiring layer to make the resistance of the electrode lines 1 kΩ or less.

Moreover, in the case that the length of the signal electrode lines is about 10 cm, it is preferred to make the resistance per unit length (length per 1 cm) of the signal electrode lines to 100Ω or less.

Moreover, it is preferred to make the electric resistivity of the auxiliary wiring layer to $5 \times 10^{-4}$ Ω·cm or less. This is because if the resistivity of the auxiliary wiring layer is over $5 \times 10^{-4}$ Ω·cm, the effect of the reduction in the resistance of the signal electrode lines by setting up the auxiliary wiring layer may not be expected.

Examples of the metal used in such an auxiliary wiring layer include tungsten (W), aluminum (Al), copper (Cu), silver (Ag), molybdenum (Mo), tantalum (Ta), gold (Au), chromium (Cr), titanium (Ti), neodymium (Nd), and alloys thereof.

Moreover, specific examples of the alloys include alloys such as Mo—W, Ta—W, Ta—Mo, Al—Ta, Al—Ti, Al—Nd and Al—Zr.

Furthermore, as the constituting material of the auxiliary wiring layer, such as TiSi$_2$, ZrSi$_2$, Hf Si$_2$, VSi$_2$, NbSi$_2$, TaSi$_2$, CrSi$_2$, WSi$_2$, CoSi$_2$, NiSi$_2$, PtSi, and Pd$_2$Si which are the compounds of a metal and silicon are preferred. Moreover, a structure wherein these metals and silicon compounds may be stacked on each other is allowable.

The electric resistivities of the metals that are preferably used in the auxiliary wiring layers used in the present embodiment are shown in Table 1.

TABLE 1

| Metal | Resistivity ($\mu\Omega \cdot$ cm) |
|---|---|
| Al | 3 |
| Cr | 25 |
| Ta | 180 |
| Ta:Mo | 40 |
| Ti | 84 |
| Mo:W | 15 |
| Mo | 53 |
| Al:Ti | 10–30 |
| Al:Ta | 10–30 |
| Al:Nd | 6–14 |

Moreover, the auxiliary wiring layer is preferably made of a metal since the metal can easily be made into a film. In this case, such a metal film may be a monolayer. However, a multilayer made of two or more metals is preferred since the film-stability thereof is high.

Such a multilayer may be formed using the above-described metals or alloys thereof. For example, in the case of three layers, a Ta layer, a Cu layer and a Ta layer may be combined and a Ta layer, an Al layer and a Ta layer may be combined. In the case of two layers, an Al layer and a Ta layer, a Cr layer and a Au layer, a Cr layer and an Al layer, and an Al layer and a Mo layer may be combined.

Here, the film-stability means a nature that a low resistivity can be kept and corrosion is not easily caused by liquid used upon etching treatment or the like. For example, in the case that the auxiliary wiring layer is made of Cu or Ag, the resistivity itself of the auxiliary wiring layer is low but the auxiliary wiring layers may easily be corroded. On the other hand, the stability of the auxiliary wiring layer can be made high by depositing a film made of a metal having superior corrosion resistance, such as Ta, Cr and Mo, on the top and the bottom of the metal film made of Cu or Ag, or on either one thereof.

Moreover, in the case that the auxiliary wiring layer is made as a metal film, the film thickness thereof is preferably set to a value within the range of 100 nm to several tens of micrometers, and particularly it is preferred to set to a value within the range of 200 nm to 5 $\mu$m.

The reasons for this are as follows. If the film thickness is below 100 nm, the resistance becomes large and is not preferred for the auxiliary wiring layer. On the other hand, if the film thickness is over several tens of micrometers, it is difficult to flatten the film. Thus, defects of the organic EL display device may be generated.

Moreover, the width (length of the short side) of the metal film depends on the resolution of the organic EL display device. For example, the width is preferably set to a value within the range of 2 $\mu$m to 1000 $\mu$m, and is more preferably set to a value within the range of 5 $\mu$m to 300 $\mu$m.

The reasons for this are as follows. If the width of the metal film is below 2 $\mu$m, the resistance of the auxiliary wiring layer may become large. On the other hand, if the width of the metal film is over 100 $\mu$m, EL light may be hindered from being taken out.

(3) Electric Insulation Layer

The electric insulation layer is disposed to attain electric insulation between the lower electrodes and the auxiliary wiring layer and levels convex portions of the pattern stripes of the auxiliary wiring layer. This electric insulation layer is a layer made of an insulation material, and the surface thereof is preferably flattened. The flatness of the electric insulation layer is preferably a value of 0.2 $\mu$m or less.

Moreover, the surface roughness of the electric insulation layer is preferably set to a value of 10 nm or less to suppress the generation of luminescent defects.

Here, the flatness of the electric insulation layer can be defined as the unevenness of the pattern stripe in the auxiliary wiring layer, measured by means of surface roughness and micro figure measuring instrument, a scanning atomic force microscope or the like.

On the other hand, the surface roughness of the electric insulation layer is roughness (unevenness) of the surface of the electric insulation layer itself, and is a value defined by the standard deviation of the surface unevenness value, in a 500 $\mu$m to 1 mm square, measured by means of surface roughness and micro figure measuring instrument or the like.

Moreover, if the constituting material of the electric insulation layer is a material having a given electric insulation, the kind thereof is not particularly limited. For example, a material having dielectric breakdown voltage of 2 MV/cm or more is preferred.

Moreover, the electric insulation layer is preferably made of a constituting material having heat resistivity exhibiting resistance against the temperature when the films of the lower electrodes are formed.

Moreover, the electric insulation layer is preferably made of a constituting material which can be etched to make fine via holes when the auxiliary wiring layer is embedded or when via holes for connecting the auxiliary wiring layer and the lower electrodes electrically are made.

Accordingly, such a constituting material may be, for example, transparent polymer, oxide, or glass.

More specifically speaking, preferred examples of the transparent polymer include such as polyimide, fluorinated polyimide, fluorine-containing polymer, polyacrylate, polyquinoline, polyoxadiazole, polyolefin having a cyclic structure, polyarylate, polycarbonate, polysulfone, and ladder-shaped polysiloxane.

Moreover, preferred examples of the oxide used as the above-described material which can be etched include such as $SiO_2$, $Al_2O_3$, $Ta_2O_3$, $Si_3N_4$, fluorine-added $SiO_2$, MgO, and $YbO_3$.

In addition to the above-described constituting material of the electric insulation layer, it is possible to use the photoresists having light-sensitivity and hardened products thereof.

However, since the organic EL element is easily deteriorated by water, oxygen and the like, it is preferred to use an electric insulation layer material having a water content of 0.1% or less by weight and a gas permeability coefficient (JIS K 7126) of $1\times10^{-13}$ cc·cm/cm$^2$·s·cmHg or less. Thus, the material may be an inorganic oxide, an inorganic nitride, or a composition of the two.

Moreover, the film thickness of the electric insulation layer is not particularly limited if the film thickness makes it possible that the auxiliary wiring layer can be embedded. It is preferred that the film thickness is, for example, larger than the film thickness of the auxiliary wiring layer and further is not more than 10 $\mu$m.

(4) Other Constituting Elements

The organic EL display device of the present embodiment comprises, as constituting elements, the organic luminescent medium, the opposed electrodes and the supporting substrate as well as the lower electrodes, the auxiliary wiring layer and the electric insulation layer.

In such an organic EL display device, the organic luminescent medium interposed between the lower electrodes and the opposed electrodes is an element comprising at least an organic luminescent layer. The organic luminescent medium may be a monolayer consisting of only an organic luminescent layer. Moreover, the organic luminescent medium may have a multilayered structure wherein a hole transport layer and the like may be stacked together with the organic luminescent layer.

Moreover, the kind of the luminescent material used in the organic luminescent layer is not particularly limited. Thus, any known material in organic EL display devices in the prior art may be used.

Examples of the organic luminescent layer include such as oxine metal complexes, stylbene-based dyes, polyphenylenevinylene derivatives, and DCM (cyanine dye) derivatives, as the materials provide the organic EL display device in a high level.

Moreover, the opposed electrodes are electrodes which form counterparts to the lower electrodes, and have charges reverse to those of the lower electrodes. If the lower electrodes are anodes, the opposed electrodes are cathodes. If the lower electrodes are cathodes, the opposed electrodes are anodes. Charges (holes or electrons) injected from the lower electrode side and charges (electrons or holes) injected from the opposed electrode side are recombined in the organic luminescent medium to generate luminescence of the organic EL display device.

Therefore, in the case that luminescence of the organic EL display device is taken out from the opposed electrode side, it is necessary to adopt the opposed electrodes having a light transmissivity of 30% or more at a luminescent wavelength.

As such a constituting material, a material which is regularly used in this kind of organic EL display device can be used as it is. Examples thereof include a transparent conductive oxide film, a super-thin metal or alloy film having a film thickness of 20 nm or less, or a lamination film of a transparent conductive oxide film and the super-thin film and the like.

In the case that the width of the auxiliary wiring layer in the present embodiment is 100 to 150% of the pitch width (100%), the light is preferably taken out from the opposed electrode side.

Moreover, as the supporting substrate, a supporting substrate which has been regularly used in this kind of organic electroluminescence display device can be used as it is if this substrate has a superior mechanical strength and a small permeability of water or oxygen. Specific examples thereof include such as glass or ceramics. A substrate on which a fluorescence converting film or a color filter is arranged may be used.

Second Embodiment

Figure 5A:
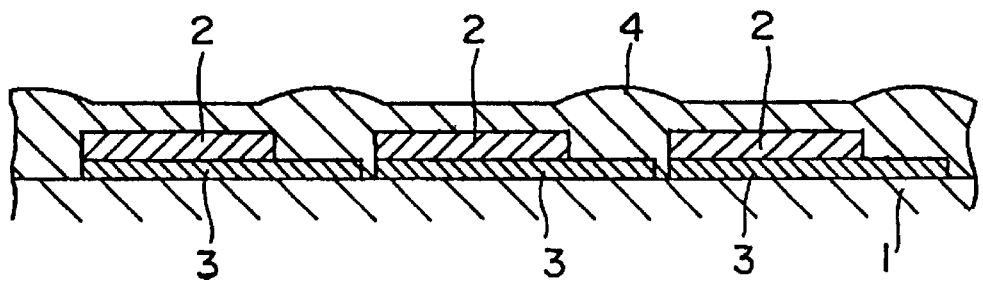
FIGS. 5(a) and 5(b) are sectional views, each of which schematically shows an organic EL display device in a second embodiment.
Figure 5B:
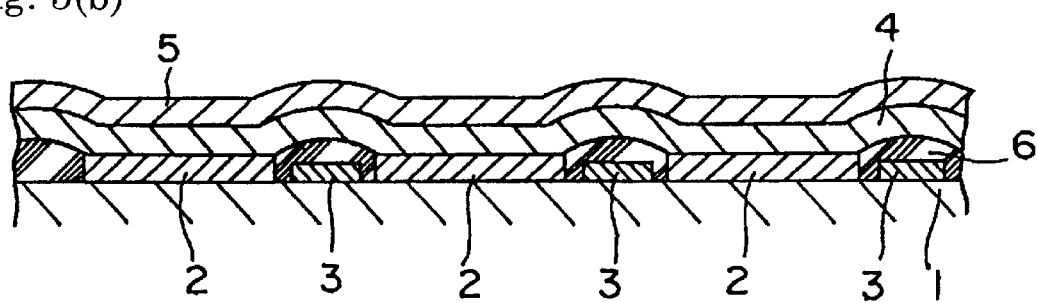
Figure 6A:
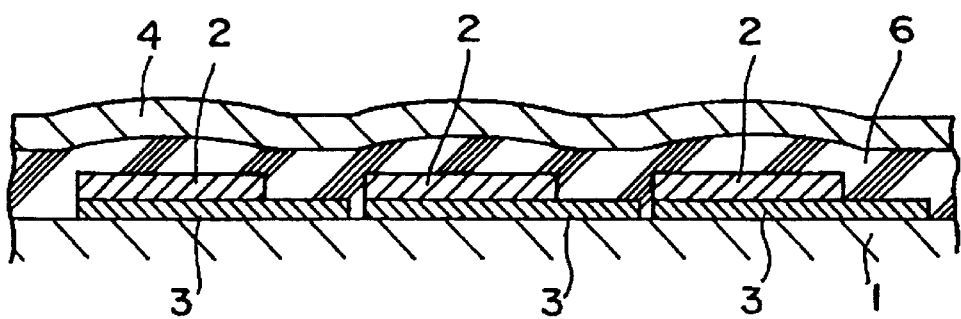
FIGS. 6(a) and 6(b) are sectional views, each of which schematically shows another form of the organic EL display device in the second embodiment.
Figure 6B:
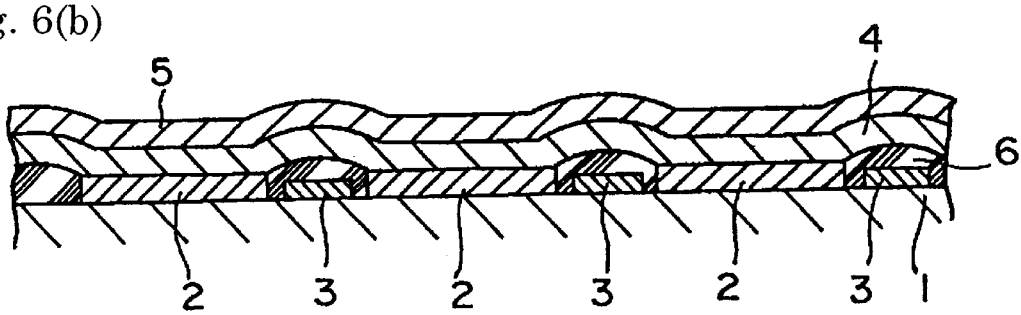
Figure 7A:
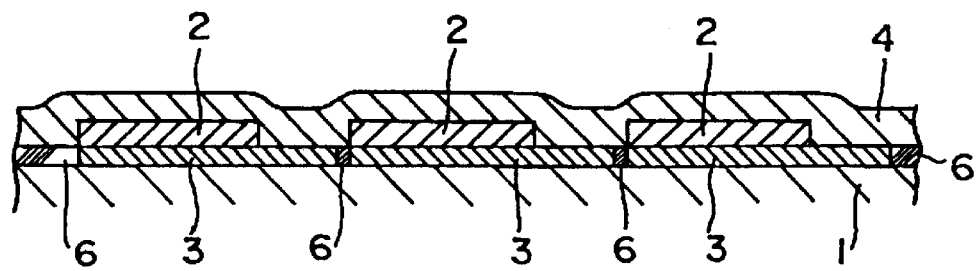
FIGS. 7(a) and 7(b) are sectional views, each of which schematically shows a further form of the organic EL display device in the second embodiment.
Figure 7B:
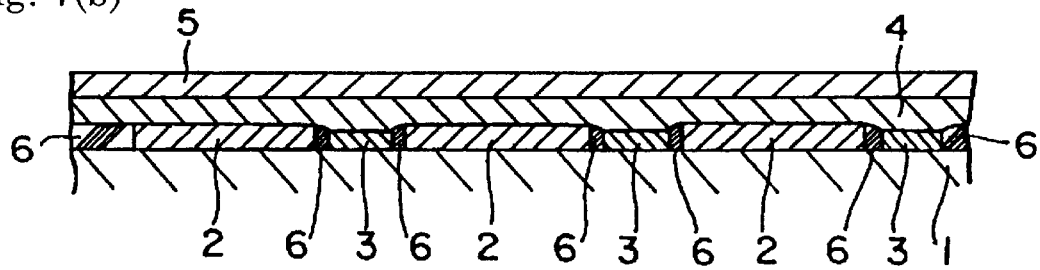

Referring to FIGS. 5 to 7, the second embodiment in the organic EL display device of the present invention will be described. FIGS. 5 to 7 are sectional views, each of which schematically shows the second embodiment of the organic EL display device. FIGS. 5(a),6(a) and 7(a) are sectional views of non-luminescent portions, respectively, and FIGS. 5(b),6(b) and 7(b) are sectional views of luminescence portions, respectively.

1. Basic Form

In the same way as in the first embodiment, the organic EL display device of the present embodiment is an organic EL display device having a supporting substrate 1 on which lower electrodes 2, an organic layer comprising an organic luminescent layer 4, and opposed electrodes 5 which are disposed in this order. The lower electrodes 2 and the opposed electrodes 5 are disposed in a XY matrix. Respective portions where the lower electrodes 2 and the opposed electrodes 5 cross constitute luminescent portions 8 (see FIG. 1).

In the present embodiment, the auxiliary wiring layer for reducing electric resistance of the lower electrodes 2 is wired in the same plane as the lower electrodes 2 and further an electric insulation layer 6 is disposed between the auxiliary wiring layer 3 and the lower electrodes 2.

The auxiliary wiring layer is wired in the same plane as the lower electrodes, that is, on the supporting substrate on which the lower electrodes are wired. In the same way as in the first embodiment, the auxiliary wiring layer is wired on non-luminescent portions which do not overlap with luminescent portions of the organic EL display device. The auxiliary wiring layer is disposed on the lower side (or upper side) of the lower electrodes in the non-luminescence portions to be electrically connected directly to the lower electrodes.

In this way, in the present embodiment, which is different from the first embodiment, the lower electrode and the auxiliary wiring layer are directly stacked on each other without a via hole being in terposed, so that they are electrically connected to each other.

The present embodiment comprising the electric insulation layer between the lower electrodes and the auxiliary wiring layer except the electric connecting portions, differs from the first embodiment.

Moreover, the electric insulation layer may be disposed between the lower electrodes and the auxiliary wiring layer except at least the electrically connecting portion, and aspects thereof are, for example, ones shown in FIGS. 5 to 7.

In FIG. 5, an electric insulation layer 6 is formed to cover the upper plane of the auxiliary wiring layer 3 wired between the respective lower electrodes 2 adjacent to each other in luminescent portions 8.

Moreover, in FIG. 6, in addition to the form of FIG. 5, the electric insulation layer 6 is further formed on a connecting portion (non-luminescent portion) of the lower electrode 2 and the auxiliary wiring layer 3.

Furthermore, in FIG. 7, an electric insulation layer 6 is formed to be filled into a space adjacent to each of the lower electrodes 2 and the auxiliary wiring layer 3.

Here, in the electric insulation layer of the present embodiment, its surface is preferably flattened in the same way as in the case of the first embodiment.

In the organic EL display device of the present embodiment, which has the above-described structure, the electric connecting portions of the auxiliary wiring layer and the lower electrodes do not overlap with the luminescent portions. Therefore, in the same way as in the case of the first embodiment, the light quantity taken out from the lower electrode side can be made large. Accordingly, the value of the luminescent brightness of the organic EL display device can be made large.

In the present embodiment, the electric insulation layer is disposed between the lower electrodes and the auxiliary wiring layer that are wired on the same plane, except the electrical connecting portions. Therefore, the level-differences resulting from the thickness (film thickness) of the lower electrodes and the auxiliary wiring layer are cancelled by the electric insulation layer. This makes it possible to decrease the generation of crosstalk by a short circuit between the opposed electrodes and the lower electrodes, display defects by the snapping of the opposed electrodes, unevenness of display and the like, which have been conventionally caused.

2. Constituting Elements

About the organic EL display device of the second embodiment having the above-described basic form, the constituting materials, the forming methods and the like of respective constituting elements, which include the supporting substrate 1, the lower electrodes 2, the auxiliary wiring layer 3, the organic luminescent medium 4, the opposed electrodes 5 and the electric insulation layer 6, are the same as in the first embodiment. Therefore, explanation thereof is omitted herein.

Third Embodiment

Hereinafter, referring to FIGS. 8 to 14, the third embodiment of the present invention will be described. FIGS. 8 to 14 are outline-explaining views, each of which schematically shows an organic EL display device in each step of the method of producing the organic EL display device according to the third embodiment. FIGS. 8 to 14 include top views and sectional views.

1. Basic Form

The third embodiment is a method of producing an organic EL display device having a supporting substrate 1 on which lower electrodes 2 electrically connected to an auxiliary wiring layer 3, an organic luminescent medium 4, and opposed electrodes 5 are successively disposed wherein the lower electrodes 2 and the opposed electrodes 5 are disposed in a XY matrix, the method of producing an organic EL display device comprising the steps of:

(1) wiring the auxiliary wiring layer 3 and the lower electrodes 2 in planes which are different in at least one part thereof; and (2) connecting the auxiliary wiring layer 3 electrically to the lower electrodes in non-luminescent portions of the organic EL display device.

By the respective steps, electric connecting portions of the auxiliary wiring layer and the lower electrodes can easily be disposed in portions other than luminescence portions. Moreover, since the auxiliary wiring layer is wired in the plane which is different from the plane in which the lower electrodes are wired, flattening is easy. Moreover, the sectional area of the auxiliary wiring layer can also be made large.

At the time of carrying out the third embodiment, it is preferred that the embodiment comprises the step of disposing an electric insulation layer between the lower electrodes and the auxiliary wiring layer. By carrying out this embodiment in this way, the auxiliary wiring layer can be embedded in the electric insulation layer to attain flattening, and further electric insulation between the auxiliary wiring layer and the lower electrodes adjacent thereto can be sufficiently kept.

At the time of carrying out the third embodiment, it is preferred that the embodiment comprises the step of making via holes in the non-luminescent portions of the organic EL display device, and connecting the auxiliary wiring layer electrically to the lower electrodes through the via holes.

When the third embodiment is carried out in this way, the snapping of the lower electrodes, resulting from difference in the thickness of the auxiliary wiring layer, is not caused so that the auxiliary wiring layer can be surely connected electrically to the lower electrodes.

Furthermore, at the time of carrying out the third embodiment, it is preferred that the embodiment comprises the step of flattening the surface of the electric insulation layer. When the embodiment is carried out in this way, the film thickness of the auxiliary wiring layer does not cause trouble so that the yield in production is improved. Thus, less crosstalk or fewer display defects can be generated.

2. Production Step

Hereinafter, referring to FIGS. 8 to 14, the following will describe the respective steps of the third embodiment specifically.

The third embodiment is a method of producing the organic EL display device of the first embodiment. The constituting materials and the structure of the produced organic EL display device are the same as in the first embodiment. Therefore, the following description is concerned with a method of forming the auxiliary wiring layer, the electric insulation layer and via holes, which are characteristic parts in the third embodiment. About the other constituting parts, for example, the lower electrodes and the organic luminescent medium, production methods known in the field of organic EL display devices can be adopted.

Figure 8A:
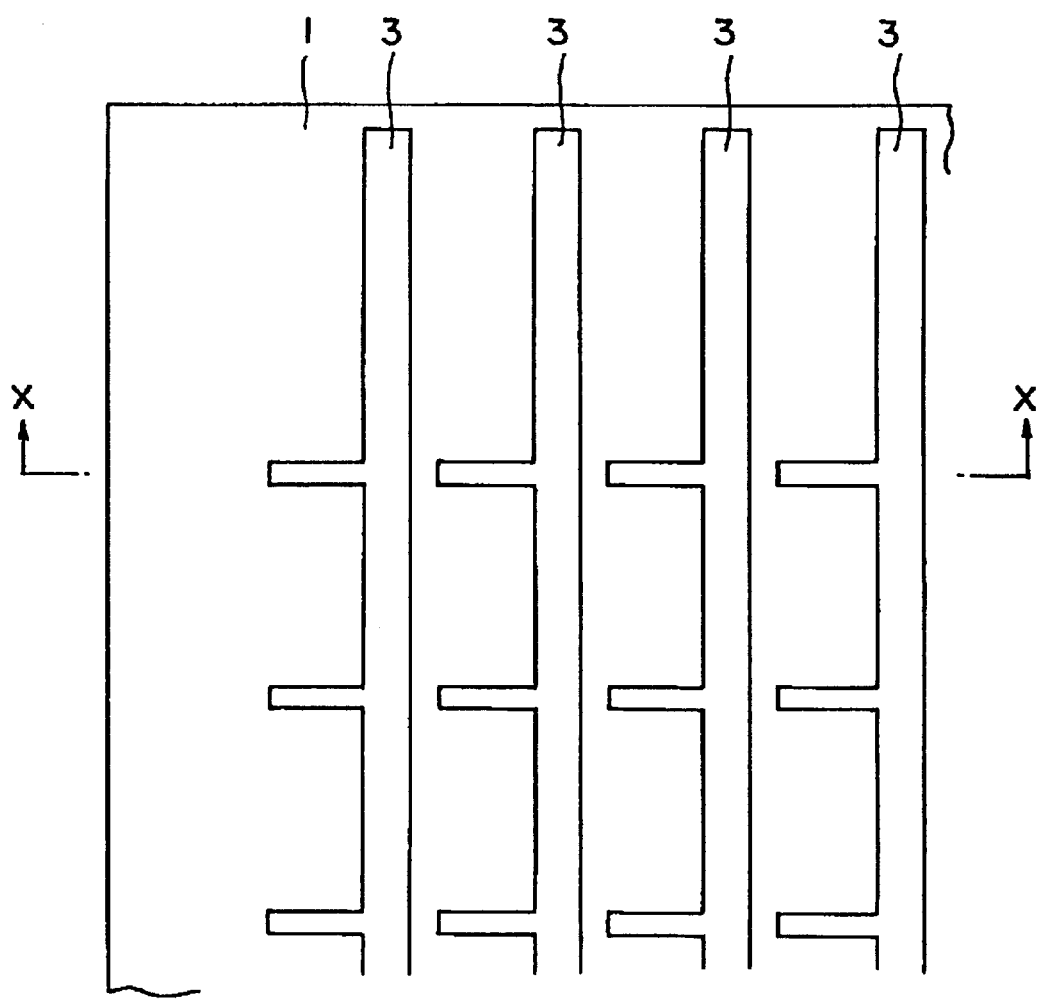
FIGS. 8(a) and 8(b) are outline-explaining views, each of which schematically shows an organic EL display device in an auxiliary wiring layer forming step of a production process in a third embodiment.
Figure 8B:
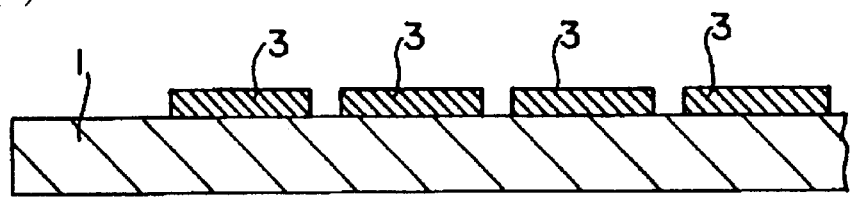

As shown in FIGS. 8(a) and 8(b), a pattern of the auxiliary wiring layer 3 is first formed on the supporting substrate 1 by a photolithography or lift-off method. At this time, the pattern of the auxiliary wiring layer 3 is wired in non-luminescent portions which do not overlap with the luminescent portions 8.

Next, the electric insulation layer 6 is formed to cover the auxiliary wiring layer 3. Since the electric insulation layer 6 is formed in the state the auxiliary wiring layer 3 is embedded therein at this time, the auxiliary wiring layer 3 does not project above the surface so that the unevenness of the auxiliary wiring layer 3 can be flattened.

Moreover, in a method of forming the electric insulation layer 6, the electric insulation layer is deposited by spin coating, roll coating, vapor deposition, CVD, sputtering or the like, and then the layer is patterned into an arbitrary shape by photolithography. At the time of depositing the film, an arbitrary mask is used to make the film into an arbitrary shape. A printing method may be used.

Figure 9:
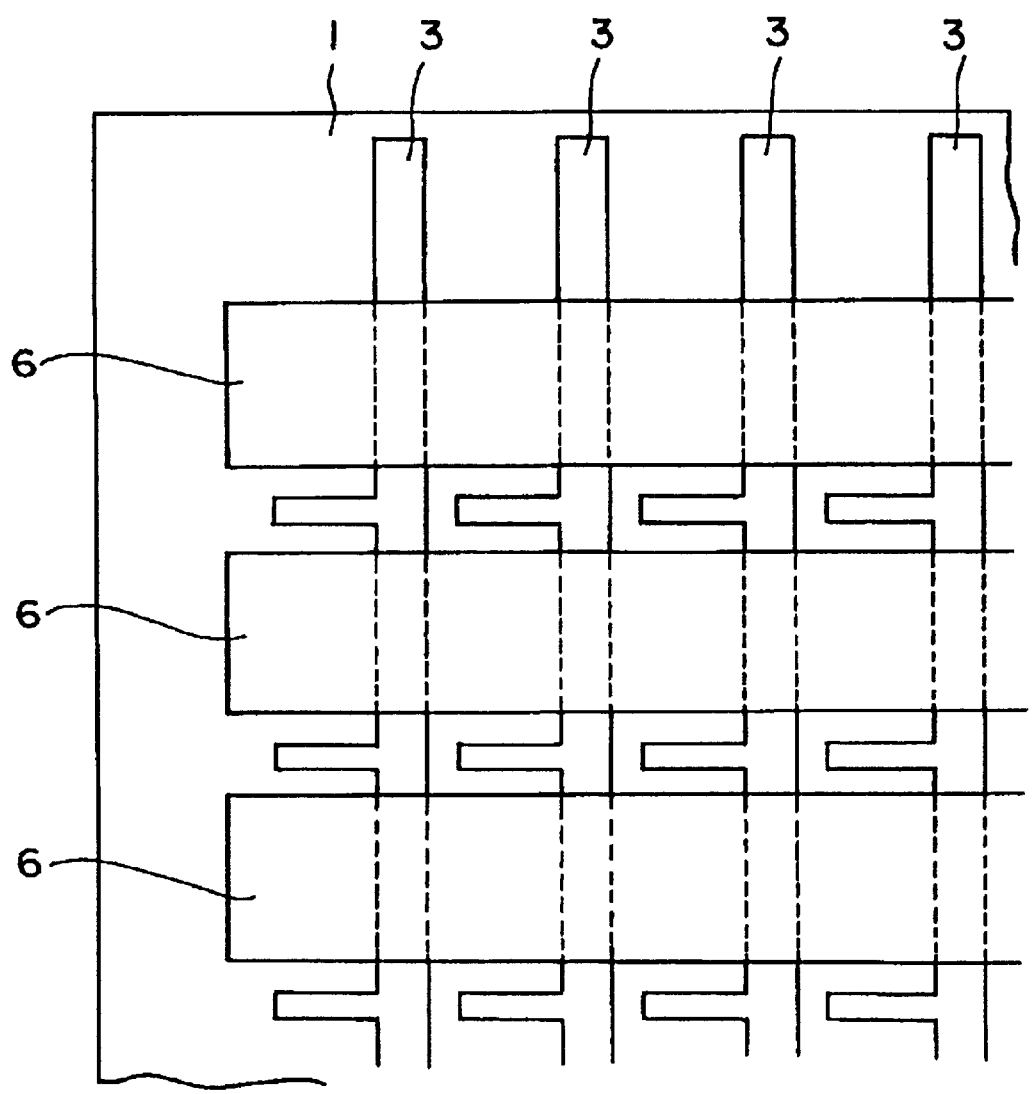
FIG. 9 is an outline top view which schematically shows the organic EL display device in an electric insulation layer forming step of the production process in the third embodiment.

For example, by using a photoresist to perform patterning, etching or lift-off, the electric insulation layer 6 is formed in given positions (positions corresponding to the lower portions of the opposed electrodes 5) as shown in FIG. 9.

Figure 10:
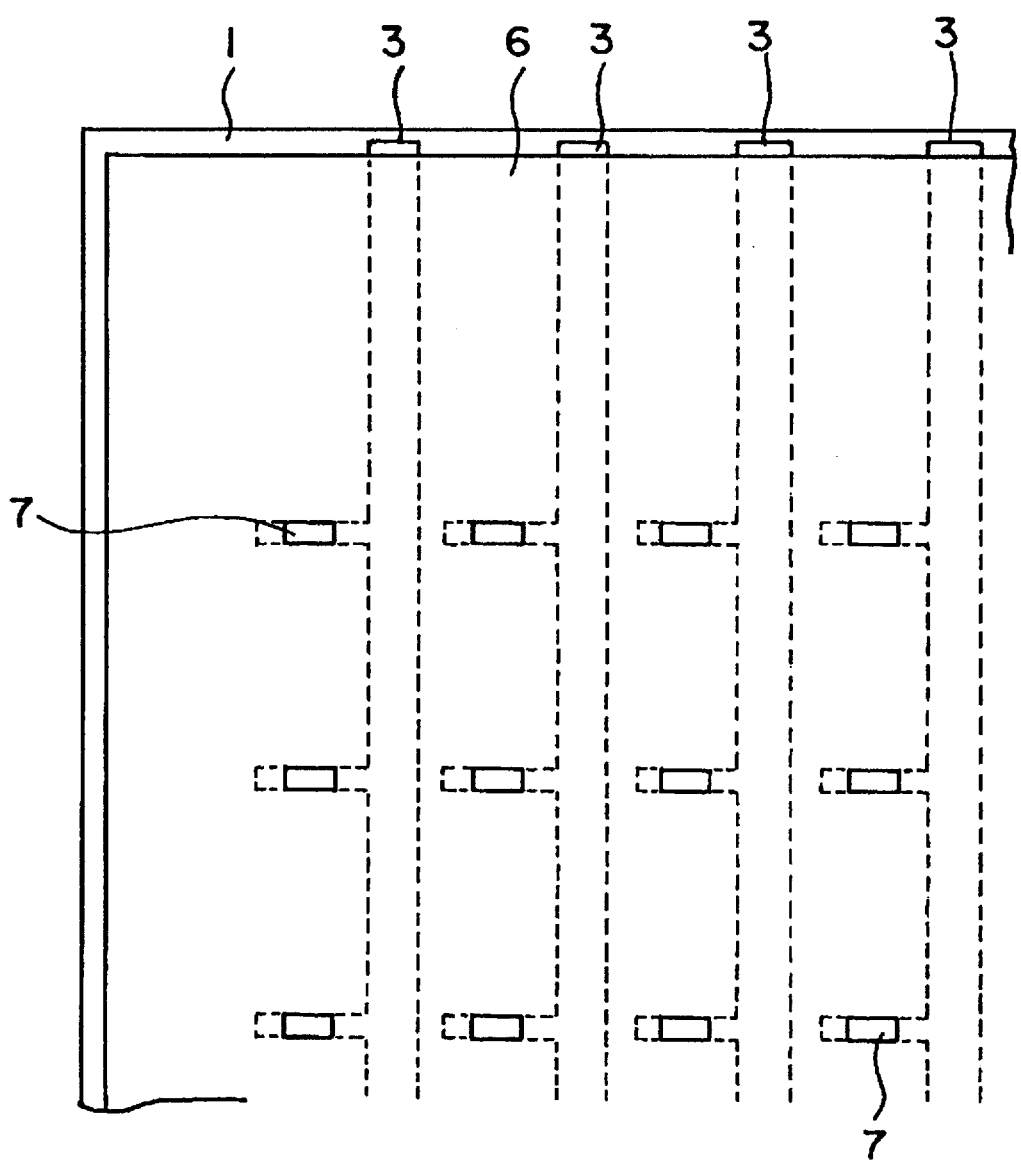
FIG. 10 is an outline top view which schematically shows the organic EL display device in an electric insulation layer forming step of the production process in the third embodiment.

Moreover, in the case that the electric insulation layer 6 having the via holes 7 as shown in FIG. 3 is formed, the electric insulation layer 6 is formed on almost all of the surface of the supporting substrate 1 and further the via holes 7 are made in given positions (positions corresponding to the non-luminescent portions of the organic EL display device), as shown in FIG. 10.

Figure 11:
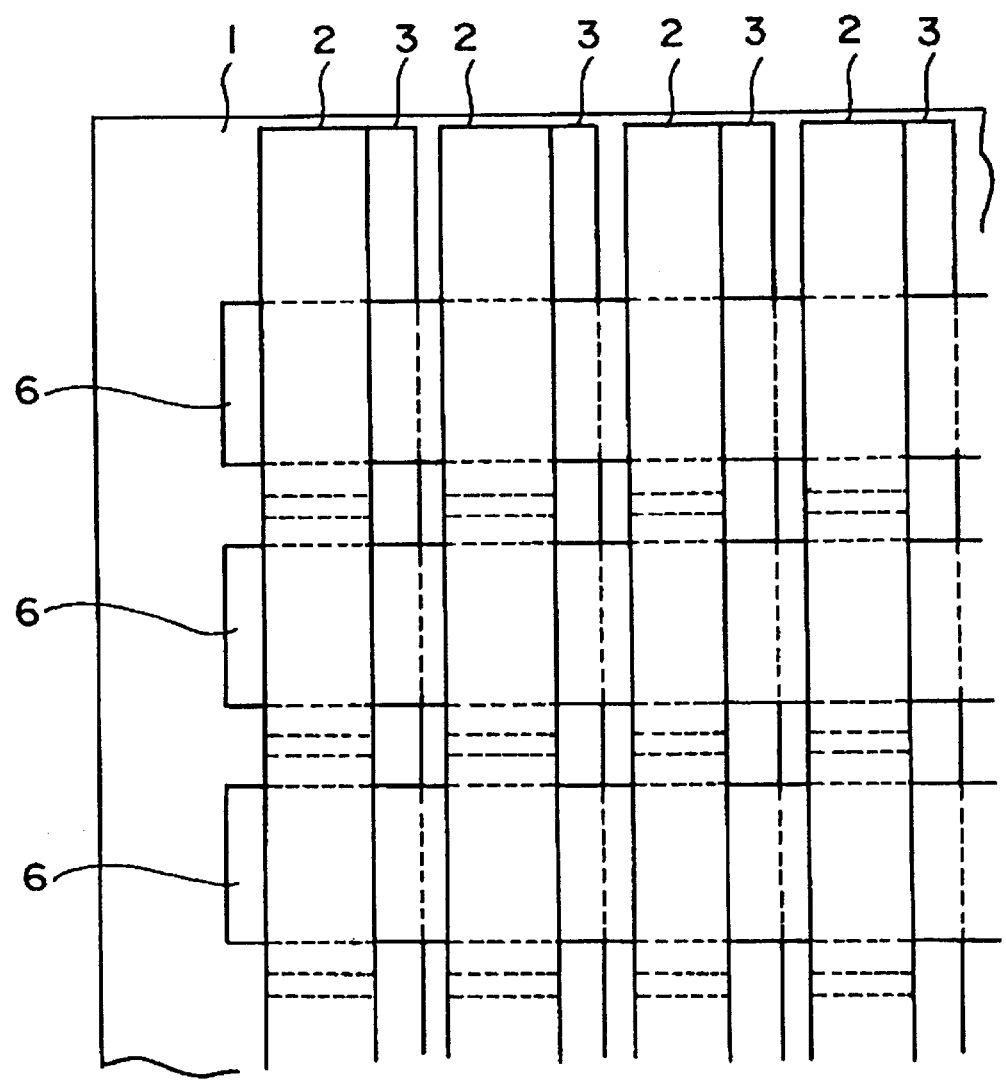
FIG. 11 is an outline top view which schematically shows the organic EL display device in a lower electrode forming step of the production process in the third embodiment.
Figure 12:
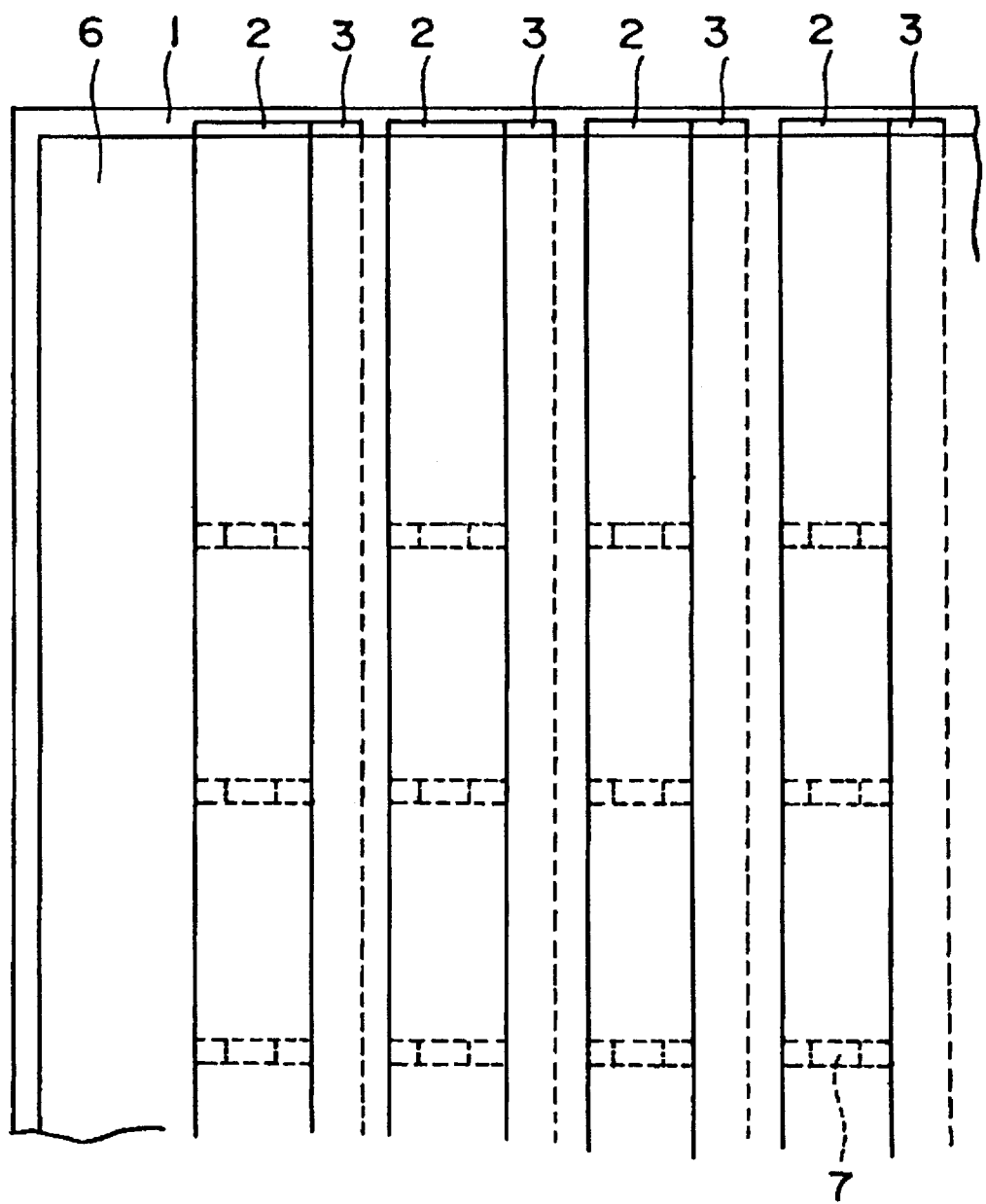
FIG. 12 is an outline top view which schematically shows the organic EL display device in a lower electrode forming step of the production process in the third embodiment.

Next, the lower electrodes 2 are made on the electric insulation layer 6 as shown in FIGS. 11 and 12 (FIG. 12 is concerned with the case that the via holes 7 are made), and then the lower electrodes 2 are connected to the auxiliary wiring layer 6.

Figure 13A:
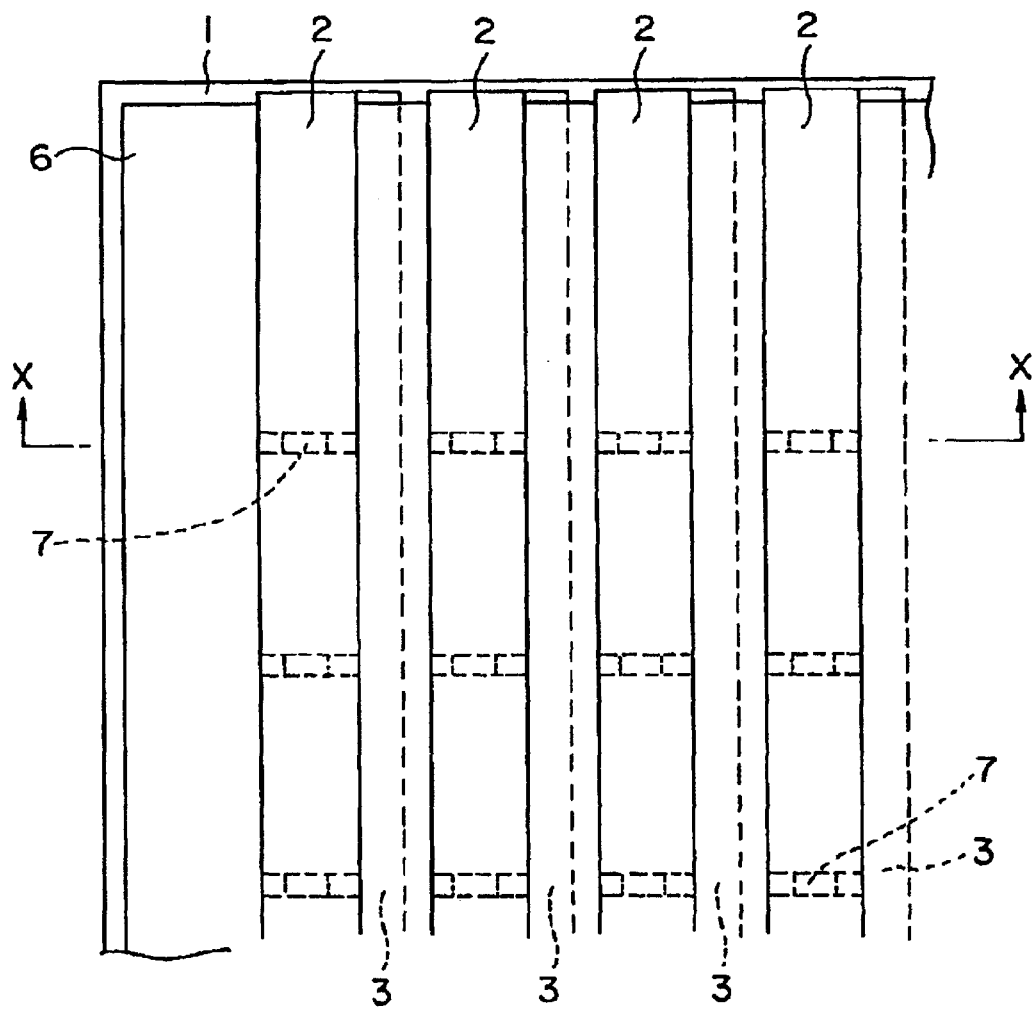
FIG. 13(a) is a top view.
Figure 13B:
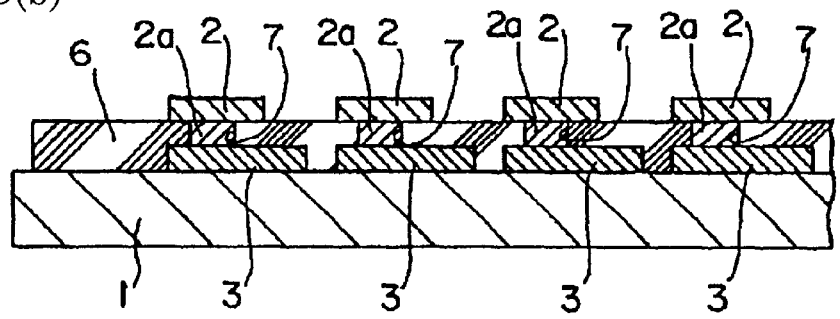

Here, in the case that the via holes 7 shown in FIG. 12 are made, the lower electrodes 2 are connected to the auxiliary wiring layer 3 through the via holes 7. Specifically, as shown in FIG. 13(b), a conductive member is filled into the via holes 7 to form the conductive portions 2a and the lower electrodes 2 are electrically connected to the auxiliary wiring layer 6 through the conductive portions 2a.

Moreover, in this case, the lower electrodes 2 themselves are filled into the via holes 7 so as to be connected to the auxiliary wiring layer 6, as shown in FIG. 4.

Figure 14:
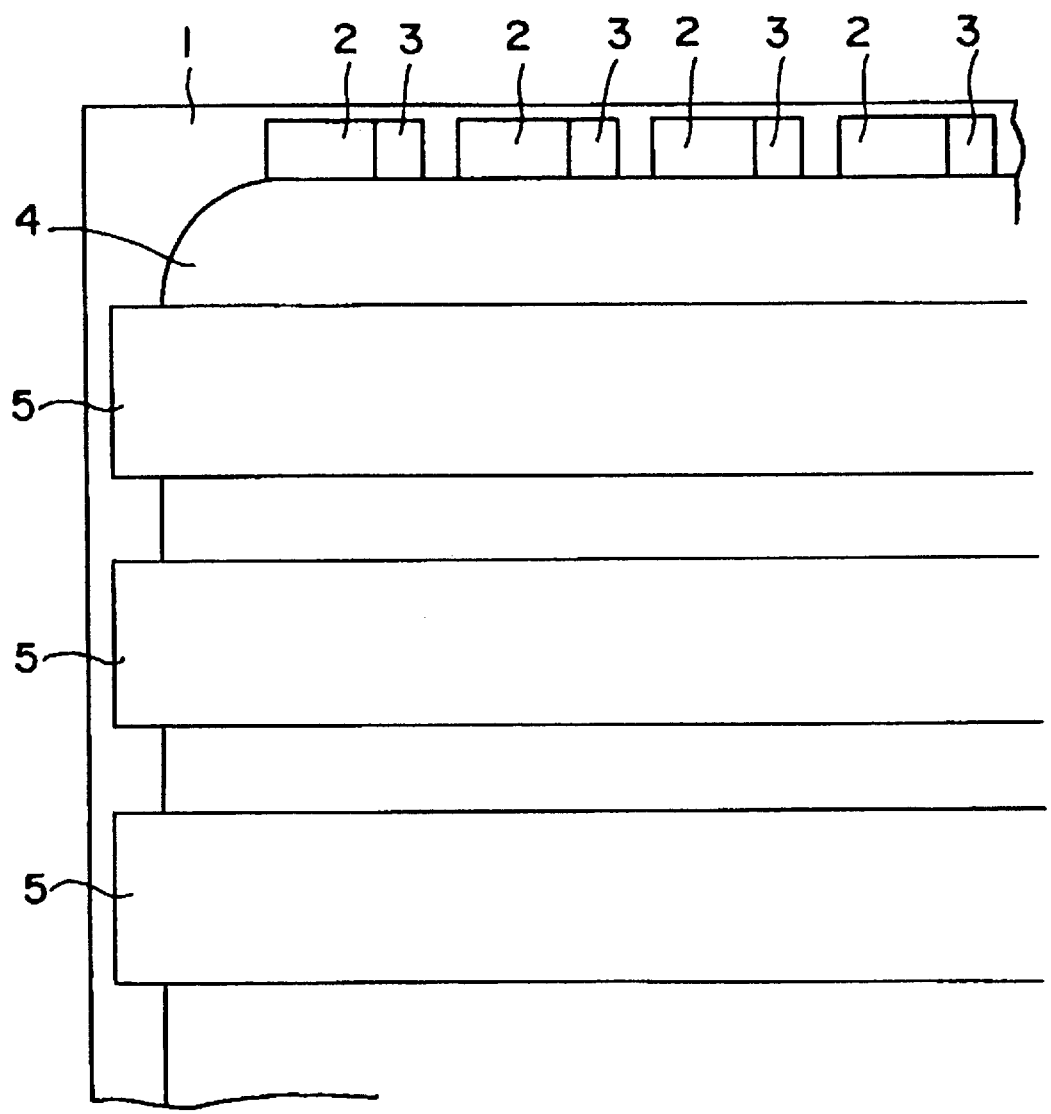
FIG. 14 is an outline-explaining view which shows the organic EL display device in an organic luminescent medium and opposed electrode forming step of the production process in the third embodiment.

Thereafter, the organic luminescent medium 4 is formed on the lower electrodes 2, as shown in FIG. 14. Furthermore, the opposed electrodes 5 are formed to be combined with the lower electrodes 2 to make a XY matrix.

In this way, an organic EL display device as shown in FIG. 1 (or FIG. 3) is completed wherein the lower electrodes 2 are electrically connected to the auxiliary wiring layer 3 in the non-luminescent portions, which do not overlap with the luminescent portions 8.

As the method of forming the auxiliary wiring layer 3 and the electric insulation layer 6, the above-described method has been given as a preferred examples. However, the method of forming them is not limited to this method, and any other method can be used.

Fourth Embodiment

The following will describe the fourth embodiment of the present invention. This embodiment is a method of producing the organic EL display device according to the second embodiment.

Specifically, the fourth embodiment is a method of producing an organic EL display device having the supporting substrate 1 on which lower electrodes 2 electrically connected to the auxiliary wiring layer 3, the organic luminescent medium 4, and the opposed electrodes 5 are successively disposed, wherein the lower electrodes 2 and the opposed electrodes 5 are disposed in an XY matrix, the method of producing an organic EL display device comprising the steps of:

(1) wiring the auxiliary wiring layer 3 in the same plane on which the lower electrodes 2 are wired;

(2) connecting the auxiliary wiring layer 3 electrically to the lower electrodes in non-luminescent portions of the organic EL display device; and (3) disposing the electric insulation layer 6 between the auxiliary wiring layer 3 and the lower electrodes, except the electric connecting portions.

By the respective steps, the electric connecting portions of the auxiliary wiring layer 3 and the lower electrodes 2 can easily be disposed in portions other than the luminescent portions 8.

Moreover, the electric insulation layer 6 is disposed between the lower electrodes 2 and the auxiliary wiring layer 3. Therefore, even if the auxiliary wiring layer 3 is wired in the same plane on which the lower electrodes 2 are wired, the electric insulation between the auxiliary wiring layer 3 and the opposed electrodes 5 can be sufficiently kept.

Furthermore, the level-differences resulting from the respective film thicknesses of the lower electrodes 2 and the auxiliary wiring layer 3 can be cancelled by the electric insulation layer 6 and the surface is flattened. Thus, the sectional area of the auxiliary wiring layer 3 can be made large. As a result, crosstalk and display defects such as generation of non-luminescence lines can be reduced.

The production process in the respective steps of the present embodiment is the same as in the third embodiment.

Fifth Embodiment

Figure 15A:
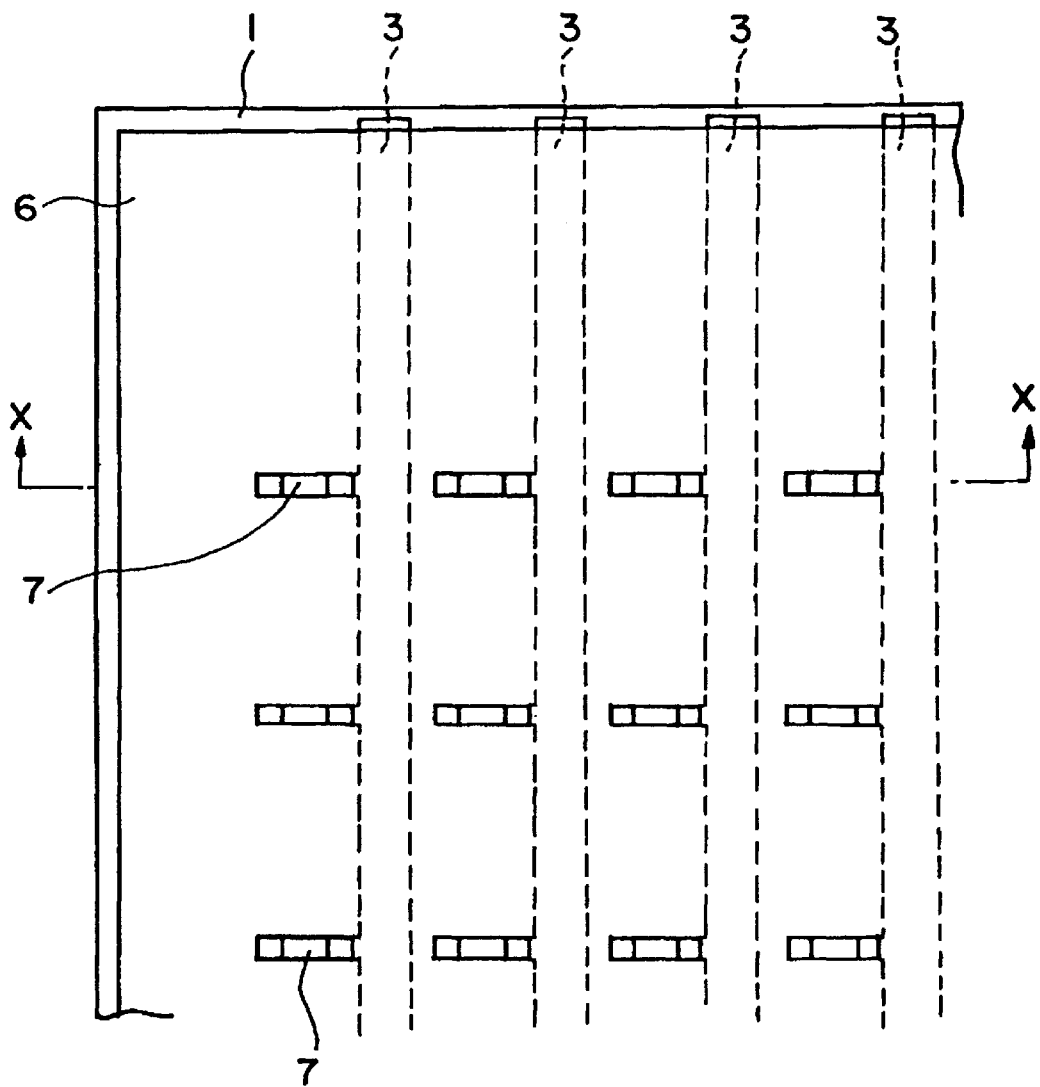
FIGS. 15(a) and 15(b) are outline-explaining views, each of which shows an electric insulation layer of an organic EL display device in a fifth embodiment.
Figure 15B:
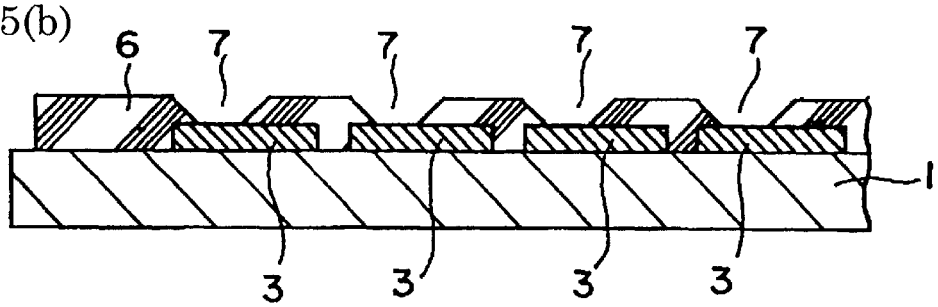

The following will describe the fifth embodiment, referring to FIG. 15. FIGS. 15(a) and 15(b) schematically show the fifth embodiment of the organic EL display device. FIG. 15(a) is a top view, and FIG. 15(b) is a sectional view taken along X-X line.

In the fifth embodiment, the aperture shape of the via holes 7 made in the organic EL display device of the first embodiment is produced into a forward-tapered form. The constituting materials and the structure of the produced organic EL display device are the same as in the first embodiment. Therefore, the following description is concerned with the shape of the via holes 7, which are characteristic parts in the fifth embodiment.

1. Basic Form

As shown in FIGS. 15(a) and 15(b), in the fifth embodiment, the side face of via holes 7 in the electric insulation layer 6 is in a forward-tapered form, in which the side face is inclined to be wider toward the lower electrodes 2 and be narrower toward the auxiliary wiring layer 3.

When the via holes 7 are made into a forward-tapered form in this way, the snapping of the lower electrodes 2 by the edge of the electric insulation layer 6 is reduced and a conductive material can easily be filled into the via holes 7 from their wide apertures. Because of the wide apertures, the contact area in the electric connecting parts of the auxiliary wiring layer 3 and the lower electrodes 2 can be made large so that the adhesiveness therebetween can be improved. Thus, the brightness distribution in display areas can be made uniform.

2. Production Process

In the fifth embodiment, the step of making the via holes 7 in the electric insulation layer 6 comprises the step of making the side face of the via holes 7 into a forward-tapered form.

In this way, a conductive material can easily be filled into the via holes, for example, using vapor deposition or the like. After the conductive material is filled into the via holes, the disconnection thereof can be made more reduced.

In a method of making the forward-tapered via holes 7, a resist whose pattern section has, for example, an overhanging shape is formed and subsequently the electric insulation layer 6 is formed. The resist is then stripped (lifted off) so that the via holes 7 can be formed. Moreover, when a light-sensitive resist is exposed to light through a mask having a via hole shape, the exposure is performed in the state that the mask is separated from a substrate. Thereafter, by developing the resist and (curing the resist if necessary), the via holes 7 can be formed.

The other production steps and the formation method may be the same as in the third embodiment.

Sixth Embodiment

Figure 16:
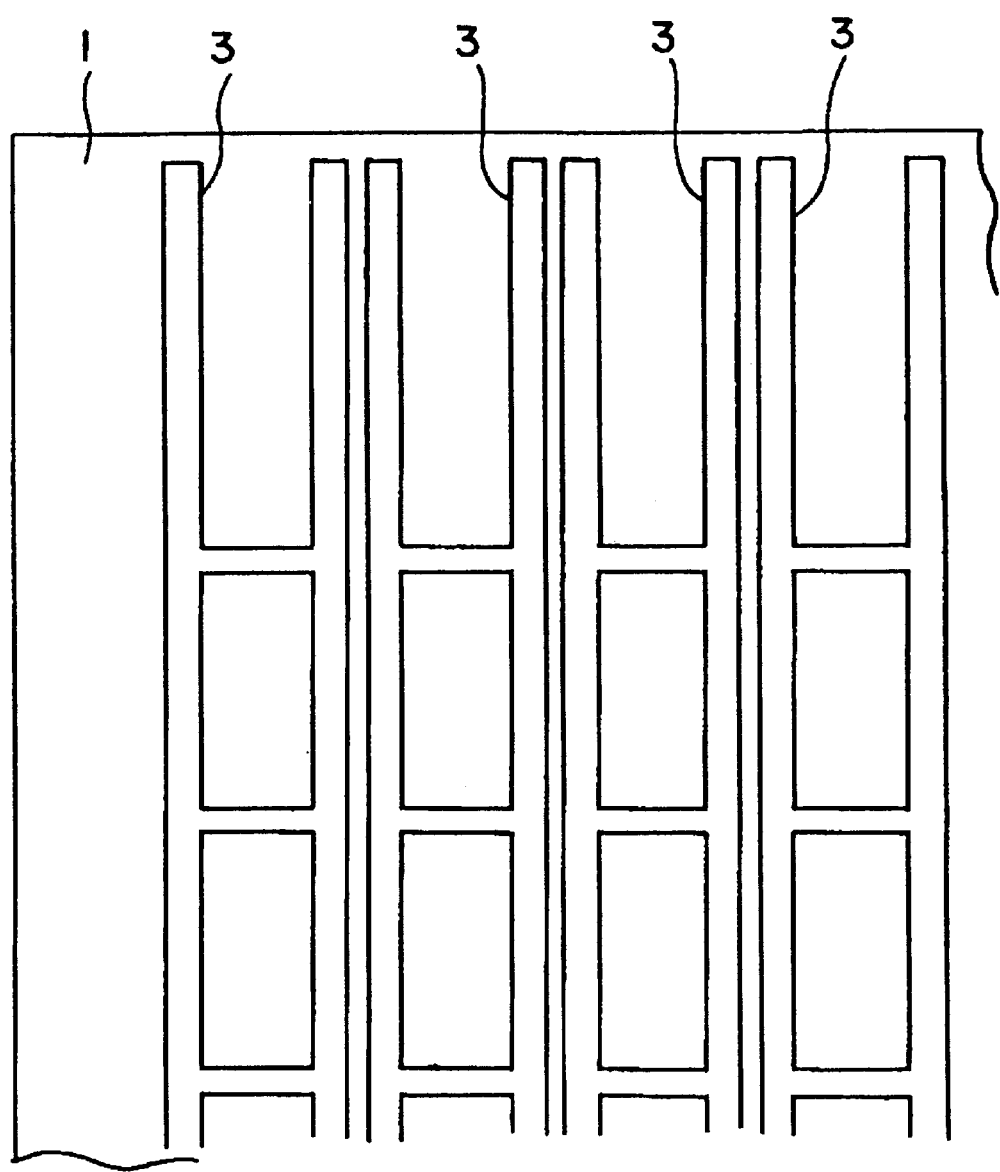
FIG. 16 is an outline top view which schematically shows an auxiliary wiring pattern of an organic EL display device in a sixth embodiment.

Furthermore, referring to FIG. 16, the sixth embodiment will be described. FIG. 16 is a top view which schematically shows the sixth embodiment of the organic EL display device.

In the sixth embodiment, the wiring pattern of the auxiliary wiring layer 3 in the organic EL display device of the first or second embodiment is modified. The other constituting materials, the structure, and the formation method thereof and the like are the same as in the first to the fourth embodiments. Therefore, the following description is concerned with the wiring pattern of the auxiliary wiring layer 3, which is a characteristic part in the sixth embodiment.

The auxiliary wiring layer 3 of the sixth embodiment is wired in non-luminescent portions which do not overlap with the luminescent portions 8 of the organic EL display device, and the wiring pattern thereof is made to a wiring pattern having a shape of a ladder formed along the respective lower electrodes 2.

As shown in FIG. 16, the auxiliary wiring layer 3 is wired in parallel and along spaces between the respective lower electrodes 2 (not shown in FIG. 16), and the in-parallel-wired portions thereof are connected to each other through a wiring pattern formed along spaces between the opposed electrodes 5 (not shown in FIG. 16), and the layer 3 is in a ladder form corresponding to each of the lower electrodes 2.

By forming the auxiliary wiring layer 3 into the wiring pattern having the ladder shape in this way, the sectional area of the auxiliary wiring layer 3 can be made wide without interference with the luminescent portions. Thus, the efficiency of the reduction in the wiring resistance is improved, and the adjusting range of electric resistivity can be kept wide. Therefore, the uniformity of the brightness in display areas can be still more improved.

EXAMPLES

Example 1

(1) Production of an Organic EL Display Device

① Formation of Auxiliary Electrodes

To produce the organic EL display device of Example 1, an aluminum as an auxiliary electrode material was first formed into a film on a glass substrate OA2 (made by Nippon Electric Glass Co., Ltd.) 1.1 mm in thickness, 100 mm in length and 100 mm in width so that the film thickness of aluminum would be 200 nm.

The glass substrate was then spin-coated with a positive resist HPR204 (made by Fuji Film Olin Co., Ltd.), and the resultant was exposed to ultraviolet rays through a photo mask. Thereafter, TMAH (tetramethylammonium hydroxide) was used as a developing solution to develop the exposed portions.

Next, an oven was used to subject the resultant to post-baking treatment at 130° C. for 10 minutes, and then an aluminum etchant (acetic acid/phosphoric acid/nitric aide) was used to etch the aluminum film.

Thereafter, a stripping solution N303 (made by Nagase & Co., Ltd.) was used to remove the positive resist. Thus, an auxiliary wiring layer having the pattern shown in FIG. 8 was formed.

② Formation of an Electric Insulation Layer

Next, by spin-coating, a negative resist IC28T-3 (made by Fuji Film Olin Co., Ltd.) was applied onto the substrate on which the auxiliary wiring layer was formed, and the resultant was exposed to ultraviolet rays through a photo mask. Thereafter, xylene was used as a developing solution to develop the unexposed portions.

Thereafter, the resultant was subjected to post-baking treatment at 160° C. for 10 minutes to obtain a resist pattern. SiO$_2$ was sputtered toward the resist pattern to form an electric insulation layer having a film thickness of 200 nm. Thereafter, a stripping solution N303 was used to remove the negative resist. As shown in FIG. 9, a pattern of the electric insulation layer was formed on the auxiliary wiring layer by a lift-off method.

③ Formation of Lower Electrodes

Next, IZO (indium zinc oxide) was sputtered on the substrate on which the electric insulation layer was formed, to form an IZO film having a film thickness of 120 nm on the electric insulation layer.

By spin-coating, a positive resist HPR204 was applied onto the IZO film. The resultant was exposed to ultraviolet rays through a photo mask and then the exposed portions were developed with TMAH.

Next, an oven was used to subject the resultant to post-baking treatment at 130° C. for 10 minutes. Thereafter, an IZO etchant (5% oxalic acid solution) was used to etch the IZO film which was not covered with the positive resist.

Thereafter, a stripping solution N303 was used to remove the positive resist. Thus, lower electrodes having the pattern shown in FIG. 11 were formed.

④ Formation of an organic EL element

The substrate on which the lower electrodes were formed was washed with isopropyl alcohol, and further cleaned with ultraviolet rays. At this time, the surfaces of the lower electrodes were observed. As a result, it was recognized that the carbon content was below 10% by atom.

Next, the washed substrate having the formed lower electrodes was fixed onto a substrate holder of a vacuum deposition device (made by ULVAC Co., Ltd.).

The following materials were filled into a heating boat made of molybdenum inside the vacuum deposition device, respectively.

Hole injecting material: 4,4',4''-tris[N-(3-methylphenyl)-N-phenylamino] triphenylamine (MTDATA), and 4,4'-bis [N-(1-naphthyl)-N-pehnylamino] biphenyl (NPD)

Organic luminescent material: 4,4'-bis(2,2-diphenylvinyl) biphenyl (DPVBi)

Electron injecting material: tris(8-quinolinol) aluminum (Alq)

Furthermore, a silver wire as an opposed electrode (cathode) material and a magnesium ribbon as the same material were set on a filament made of tungsten and the heating boat made of molybdenum, respectively.

In this state, the evacuated pressure in a vacuum vessel was reduced to 665×10$^{-7}$ Pa (1×10$^{-7}$ Torr). Without breaking the vacuum state from the formation of a hole injected layer to the formation of cathodes, the respective layers were successively deposited by evacuating one time, in such a manner that the following deposition rates and film thicknesses would be attained. Thus, an organic EL element as shown in FIGS. 1 and 14 was formed. This element was an organic EL display device of Example 1.

Moreover, silver and magnesium as the opposed electrodes were simultaneously deposited, respectively. They were deposited into a film having a total thickness of 200 nm.

MTDATA: deposition rate=0.1–0.3 nm/sec. thickness=60 nm,

NPD: deposition rate=0.1–0.3 nm/sec. thickness=20 nm,

DPVBi: deposition rate=0.1–0.3 nm/sec. thickness=50 nm,

Alq: deposition rate=0.1–0.3 nm/sec. thickness=20 nm,

Ag: deposition rate=1.3–1.4 nm/sec. thickness=200 nm (the total thickness of Ag and Mg), and Mg: deposition rate=0.1 nm/sec.

(2) Evaluation of the Organic EL Display Device

In the resultant organic EL display device, a DC voltage of 12 V was applied between the lower electrodes (anodes) and the upper electrodes (cathodes), which were the opposed electrodes, to cause luminescence from pixels in portions where the respective electrodes crossed.

In this state, a Chroma meter CS 100 (made by Minoluta Co., Ltd.) was used to measure the luminescent brightness. As a result, a value of 300 cd/m$^2$ was obtained. According to JIS Z 8701, the CIE chromaticity coordinate was measured. It was recognized that intensely blue luminescence wherein CIEx=0.14 and CIEy=0.20 was obtained.

Furthermore, in the resultant organic EL display device, crosstalk was hardly observed, and in 240 lines thereof neither luminescence of any adjacent line nor defective display was observed.

Example 2

(1) Production of an Organic EL Display Device

A substrate on which an auxiliary wiring layer was formed was produced under the same conditions as in Example 1.

Next, a negative resist IC28T-3 (made by Fuji Film Olin Co., Ltd.) was subjected to spin-coating, and the resultant was exposed to ultraviolet rays through a photo mask. Thereafter, xylene was used as a developing solution to develop the unexposed portions. Thereafter, the resultant was subjected to post-baking treatment at 160° C. for 10 minutes to obtain a resist pattern. SiO$_2$ was sputtered toward the resist pattern to form an electric insulation layer having a film thickness of 200 nm.

Next, a stripping solution N303 was used to remove the negative resist. As shown in FIG. 10, via holes surrounded by the electric insulation layer were formed on the auxiliary wiring layer. Moreover, an SEM (Scanning Electron Microscopy) was used to observe the appearance of the via holes. As a result, it was recognized that the section of the via holes was rectangular.

Hereinafter, under the same conditions as in Example 1 (concerning the step of forming lower electrodes, see FIGS. 12 and 13), the organic EL display device shown in FIG. 3 was produced.

(2) Evaluation of the Organic EL Display Device

In the resultant organic EL display device, a DC voltage of 12 V was applied between the lower electrodes (anodes) and the upper electrodes (cathodes), which were the opposed electrodes, to cause luminescence from pixels in portions. where the respective electrodes crossed. The Chroma meter CS 100 (made by Minoluta Co., Ltd.) was used to measure the luminescent brightness. As a result, a value of 300 cd/m$^2$ was obtained. According to JIS Z 8701, the CIE chromaticity coordinate was measured. It was recognized that intensely blue luminescence wherein CIEx=0.14 and CIEy=0.20 was obtained.

Furthermore, in the resultant organic EL display device, crosstalk was hardly observed, and in 240 lines thereof neither luminescence of any adjacent line nor defective display was observed.

Example 3

(1) Production of an Organic EL Display Device

An organic EL display device was produced in the same way as in Example 1 except that forward-tapered via holes (see FIG. 15) were formed instead of the rectangular via holes in Example 2. Specifically, an organic EL display device was produced in the same way as in Example 2 except that a negative resist ZPN1100 (made by Nippon Zeon Co., Ltd.) whose pattern section was in an overhanging form was used on the substrate on which the auxiliary wiring layer was formed. The appearance of the via holes was observed with the SEM. As a result, it was recognized that the section of the via holes was in a forward-tapered form.

(2) Evaluation of the Organic EL Display Device

In the resultant organic EL display device, a DC voltage of 12 V was applied between the lower electrodes (anodes) and the upper electrodes (cathodes), which were the opposed electrodes, to cause luminescence from pixels in portions where the respective electrodes crossed. The Chroma meter CS 100 was used to measure the luminescent brightness. As a result, a value of 300 cd/m$^2$ was obtained. Moreover, the lower electrodes and the upper electrodes were respectively selected to cause luminescence. The brightness distribution in the entire display areas (the number of pixels: about 60000 (240 lines×240 lines)) was within the range of ±10 cd/m$^2$. It was recognized that the entire display areas emitted light uniformly.

According to JIS Z 8701, the CIE chromaticity coordinate was measured. It was recognized that intensely blue luminescence wherein CIEx=0.14 and CIEy=0.20 was obtained.

Furthermore, in the resultant organic EL display device, crosstalk was hardly observed, and in 240 lines thereof neither luminescence of any adjacent line nor defective display was observed.

Example 4

(1) Production of an Organic EL Display Device

An organic EL display device was produced in the same way as in Example 2 except that an acrylic negative resist was used instead of SiO$_2$, which was the electric insulation layer in Example 2.

Specifically, by spin-coating, an acrylic negative resist V259PA (made by Nippon Steel Chemical Co., Ltd.) was applied onto the substrate on which the auxiliary wiring layer was formed. With a gap between a photo mask and the substrate (proximity gap: 500 μm), the resultant was exposed to ultraviolet rays. Thereafter, the unexposed portions were developed with TMAH as a developing solution, and the resultant was subjected to post-baking treatment at 180° C. for 10 minutes. Thus, the film thickness of the electric insulation layer was made to 200 nm.

(2) Evaluation of the Organic EL Display Device

In the resultant organic EL display device, a DC voltage of 12 V was applied between the lower electrodes (anodes) and the upper electrodes (cathodes), which were opposed electrodes, to cause luminescence from pixels in portions where the respective electrodes crossed. The Chroma meter CS 100 was used to measure the luminescent brightness. As a result, a value of 300 cd/M$^2$ was obtained. Moreover, the lower electrodes and the upper electrodes were respectively selected to cause luminescence. The brightness distribution in the entire display areas was within the range of ±10 cd/m$^2$. It was recognized that the entire display areas emitted light uniformly.

According to JIS Z 8701, the CIE chromaticity coordinate was measured. It was recognized that intensely blue luminescence wherein CIEx=0.14 and CIEy=0.20 was obtained.

Furthermore, in the resultant organic EL display device, crosstalk was hardly observed, and in 240 lines thereof neither luminescence of any adjacent line nor defective display was observed.

Example 5

(1) Production of an Organic EL Display Device

To produce the organic EL display device of Example 5, aluminum was sputtered into a film onto a supporting substrate made of the same glass substrate OA2 (made by Nippon Electric Glass Co., Ltd.) as in Example 1, so that the film thickness of aluminum would be 200 nm. Furthermore, chromium was sputtered and laminated so that the film thickness thereof would be 50 nm.

Next, by spin-coating, a positive resist HPR204 (made by Fuji Film Olin Co., Ltd.) was applied onto the supporting substrate, and the resultant was exposed to ultraviolet rays through a photo mask. Thereafter, TMAH (tetramethylammonium hydroxide) was used as a developing solution to develop the exposed portions. The resultant was then subjected to post-baking treatment at 130° C. for 10 minutes.

Thereafter, a chromium etchant HCE (made by Nagase & Co., Ltd.) composed of an aqueous solution of cerium ammonium nitrate/perchloric acid and an aluminum etchant composed of acetic acid/phosphoric acid/nitric acid were used to etch the naked chromium and aluminum films. Thereafter, a stripping solution N303 (made by Nagase & Co., Ltd.) was used to remove the positive resist. Thus, an auxiliary wiring layer composed of the pattern shape shown in FIG. 8 was formed.

Next, ITO (indium tin oxide) was sputtered into a film having a thickness of 120 nm on the substrate on which the auxiliary wiring layer was formed, and then chromium was sputtered into a layer onto the ITO.

The same positive resist as described above was applied onto this substrate by spin-coating, and then the resultant was exposed to ultraviolet rays through a photo mask positioned correspondingly to the shape of the lower electrodes as shown in FIG. 11. Furthermore, TMAH as a developing solution was used to develop the resist. The resultant was subjected to post-baking treatment at 130° C. for 10 minutes.

Next, the same chromium etchant as described above, composed of the aqueous solution of cerium ammonium nitrate/perchloric acid and an ITO etchant composed of 47% hydrogen bromide solution were used to etch the chromium/ITO layer not covered with the resist. Thereafter, the same stripping solution as described above was used to remove the positive resist.

Thus, a chromium/ITO pattern layer corresponding to the lower electrodes shown in FIG. 11 was formed (no electric insulation layer 6 shown in FIG. 11 was present in the present embodiment).

Next, by spin-coating, an acrylic negative resist V259PA (made by Nippon Steel Chemical Co., Ltd.) was applied onto the substrate on which the chromium/ITO pattern was formed, and then the resultant was subjected to rear exposure (back flashing) from the supporting substrate side. Thereafter, the unexposed portions were developed with a developing solution, and the resultant was subjected to post-baking treatment at 180° C. for 10 minutes. Thus, an electric insulation layer was formed.

Subsequently, the chromium etchant was used to strip chromium on the chromium/ITO pattern (corresponding to lower electrodes) and chromium on the auxiliary wiring layer, so as to complete the lower electrodes composed of the ITO pattern and the auxiliary wiring layer composed of the aluminum pattern and further complete the electric insulation layer filled into spaces between the lower electrodes and the auxiliary wiring layer (see FIG. 7). Hereinafter, under the same conditions as in Example 1, an organic EL display device having the electric insulation layer shown in FIG. 7 was produced.

(2) Evaluation of the Organic EL Display Device

In the resultant organic EL display device, a DC voltage of 12 V was applied between the lower electrodes (anodes)

and the upper electrodes (cathodes), which were opposed electrodes, to cause luminescence from pixels in portions where the respective electrodes crossed. The Chroma meter CS 100 was used to measure the luminescent brightness. As a result, a value of 300 cd/m$^2$ was obtained.

According to JIS Z 8701, the CIE chromaticity coordinate was measured. It was recognized that intensely blue luminescence wherein CIEx=0.14 and CIEy=0.20 was obtained.

Furthermore, in the resultant organic EL display device, crosstalk was hardly observed, and in 240 lines thereof neither luminescence of any adjacent line nor defective display was observed.

Comparative Example 1

(1) Production of an Organic EL Display Device

Figure 18:
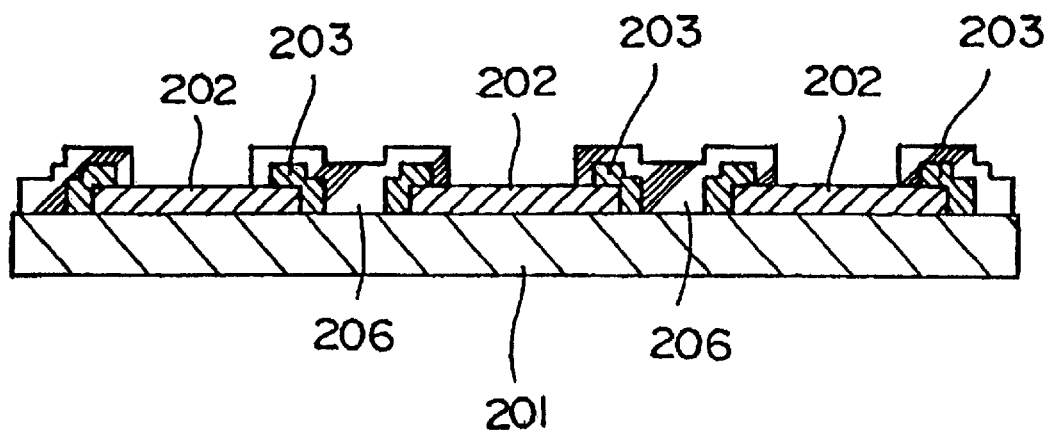
FIG. 18 is an outline sectional view which schematically shows an organic EL element having metal electrodes around conventional transparent electrodes.
Figure 19:
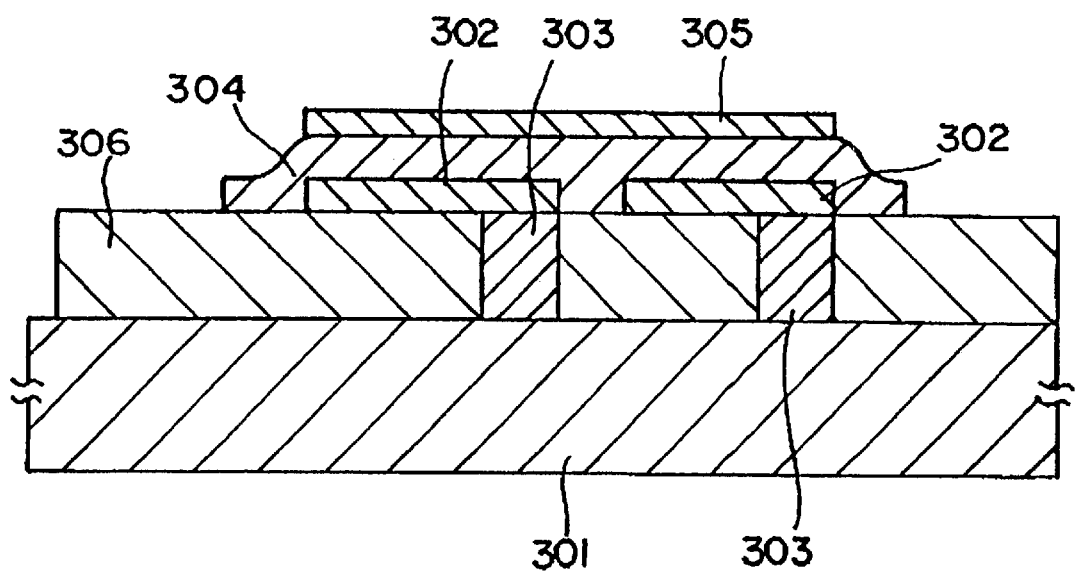
FIG. 19 is an outline sectional view which schematically shows an organic EL display device having conventional auxiliary wiring layer.

An organic EL display device was produced in the same way as in Example 1 except the following: about the structure of the organic EL display device of Comparative Example 1, the auxiliary wiring layer was electrically connected directly to the lower electrodes in Example 1; the electric connecting portions were disposed by depositing the auxiliary wiring layer on the side portions of the luminescent portions of the organic EL display device, that is, the edge sides of the lower electrodes; and an electric insulation layer was disposed to cover the electric connecting portions (see FIG. 18).

(2) Evaluation of the Organic EL Display Device

In the resultant organic EL display device, a DC voltage of 12 V was applied between the lower electrodes and the opposed electrodes, to cause luminescence from pixels in portions where the respective electrodes crossed. The Chroma meter CS 100 was used to measure the luminescent brightness. As a result, a value of 250 cd/m$^2$, which was lower than the luminescent brightness of Example 1, was obtained.

The cause thereof can be considered as follows. In Comparative Example 1, the auxiliary wiring layer overlapped partially with the lower electrodes. Therefore, the luminescence quantity which could be taken out was reduced.

In Comparative Example 1, the CIE chromaticity coordinate thereof was also as follows: CIEx=0.14 and CIEy=0.20. Thus, it was proved that intensely blue luminescence was obtained.

Furthermore, in the resultant organic EL display device, crosstalk was generated at 10 or more positions. It was recognized that luminescence of adjacent lines, based on this, or defective display (non-luminescence of lines) based on disconnection was observed in 15 lines among 240 lines. The cause thereof can be considered as follows. Since the auxiliary wiring layer wired in the same plane, on which the lower electrodes were wired, was formed to overlap with the edge sides of the lower electrodes; therefore, the level-differences resulting from the film thicknesses of the lower electrodes and the auxiliary wiring layer or the lamination heights thereof became more notable to cause a short circuit between the lower electrodes and the opposed electrodes or the snapping of the opposed electrodes.

Comparative Example 2

(1) Production of an Organic EL Display Device

Figure 17A:
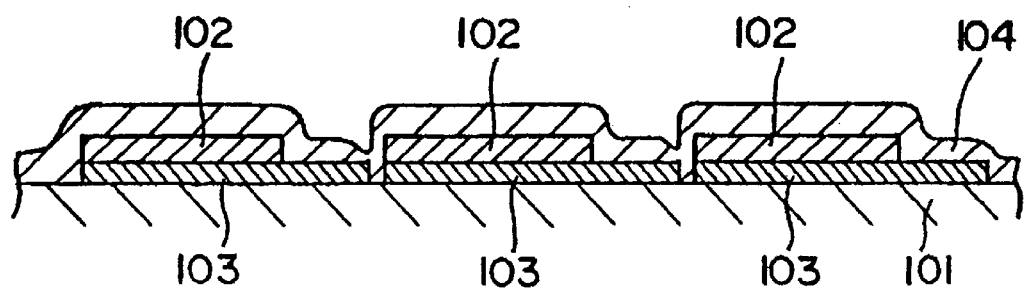
FIG. 17(a) is a sectional view of a lamination portion of the auxiliary electrodes and first electrodes.
Figure 17B:
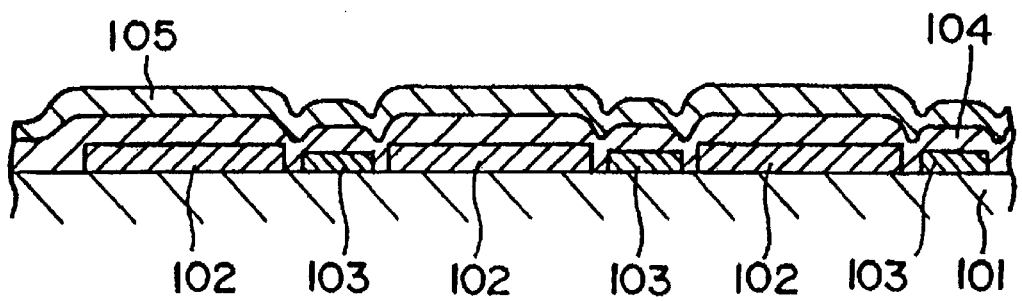
FIG. 17(b) is a sectional view of a wiring portion of the auxiliary electrodes.

An organic EL display device was produced in the same way as in Example 1 except that, about the structure of the organic EL display device of Comparative Example 2, no electric insulation layer was disposed and the auxiliary wiring layer and the lower electrodes were wholly formed on the same face and were electrically connected (see FIG. 17).

(2) Evaluation of the Organic EL Display Device

In the resultant organic EL display device, a DC voltage of 12 V was applied between the lower electrodes and the opposed electrodes, to cause luminescence from pixels in portions where the respective electrodes crossed. The Chroma meter CS 100 was used to measure the luminescent brightness. As a result, a value of 300 cd/m$^2$ was obtained. Moreover, the CIE chromaticity coordinate thereof was also as follows: CIEx=0.14 and CIEy=0.20. Thus, it was proved that intensely blue luminescence was obtained.

Furthermore, in the resultant organic EL display device, crosstalk was generated at 10 or more positions. It was recognized that luminescence of adjacent lines, based on this, or defective display (non-luminescence of lines) based on disconnection was observed in 10 lines among 240 lines.

The cause of the generation of much crosstalk and the increase in display defects can be considered as follows. The auxiliary wiring layer and the lower electrodes were on the same face and thus the level-differences resulting from the thicknesses (film thicknesses) thereof became large. The frequency that the level-differences were generated increased. These facts resulted in the generation of short circuits between the opposed electrodes and the lower electrodes or between the opposed electrodes and the auxiliary wiring layer, or the snapping of the opposed electrodes.

TABLE 2

|  | Reference view of the structure | Lower electrodes | Auxiliary electrodes | Electrically connecting portions | Luminescent brightness Cd/m$^2$ | CIEx CIEy | The number of display defects |
|---|---|---|---|---|---|---|---|
| Example 1 | FIG. 1 | IZO 120 nm | Al 200 nm | Non-luminescent portions | 300 | 1.14 0.20 | 0/240 |
| Example 2 | FIG. 3 | IZO 120 nm | Al 200 nm | Non-luminescent portions | 300 | 0.14 0.20 | 0/240 |
| Example 3 | FIG. 15 | IZO 120 nm | Al 200 nm | Non-luminescent portions | 300 | 0.14 0.20 | 0/240 |
| Example 4 | FIG. 3 | IZO 120 nm | Al 200 nm | Non-luminescent portions | 300 | 0.14 0.20 | 0/240 |
| Example 5 | FIG. 7 | ITO 120 nm | Al 200 nm | Non-luminescent portions | 300 | 0.14 0.20 | 0/240 |
| Comparative Example 1 | FIG. 18 | IZO 120 nm | Al 200 nm | Luminescent portions | 250 | 0.14 0.20 | 15/240 |

TABLE 2-continued

| | Reference view of the structure | Lower electrodes | Auxiliary electrodes | Electrically connecting portions | Luminescent brightness $Cd/m^2$ | CIEx CIEy | The number of display defects |
|---|---|---|---|---|---|---|---|
| Comparative Example 2 | FIG. 17 | IZO 120 nm | Al 200 nm | Non-luminescent portions | 300 | 0.14 0.20 | 10/240 |

Industrial Applicability

As described in detail, the organic EL display device (first invention) of the present invention includes at least portions where an auxiliary wiring layer and lower electrodes are wired on different faces. Furthermore, the auxiliary wiring layer is electrically connected in non-luminescent portions of the organic EL display device. Thus, the value of the luminescent brightness thereof becomes large, and the film thickness of the auxiliary wiring layer does not cause any trouble. Moreover, the sectional area of the auxiliary wiring layer is large and the uniformity of the luminescent brightness is high. The power consumption can be made small. Display defects are fewer. Such an organic EL display device having high quality can be provided.

According to the organic EL display device (second invention) of the present invention, an auxiliary wiring layer and lower electrodes are wired in the same plane, and the auxiliary wiring layer is electrically connected to the lower electrodes in non-luminescent portions in the organic EL display device. Moreover, an electric insulation layer is disposed between the auxiliary wiring layer and the lower electrodes, except the electric connecting portions. Thus, the electric connecting portions of the auxiliary wiring layer and the lower electrodes do not overlap with luminescent portions. Therefore, the light quantity taken out from the lower electrode side can be made large. As a result, it is possible to provide a high-quality organic EL display device having a large value of luminescent brightness and giving less display defects.

The method of producing an organic EL display device (third invention) of the present invention comprises the steps of wiring an auxiliary wiring layer and lower electrodes on faces which are partially different; and connecting the auxiliary wiring layer electrically to the lower electrodes in non-luminescent portions of the organic EL display device. In this way, the electric connecting portions of the auxiliary wiring layer and the lower electrodes can easily be disposed in other than luminescent portions. The auxiliary wiring layer and the lower electrodes are wired on faces which are different in the perpendicular direction, so that they can easily be made flat. Furthermore, crosstalk and display defects such as generation of non-luminescence lines can be reduced even if the sectional area of the auxiliary wiring layer is made large.

The method of producing an organic EL display device (fourth invention) of the present invention comprises the steps of wiring an auxiliary wiring layer and lower electrodes on the same face; connecting the auxiliary wiring layer electrically to the lower electrodes in non-luminescent portions of the organic EL display device; and disposing an electric insulation layer between the auxiliary wiring layer and the lower electrodes, except the electric connecting portions. In this way, the electric connecting portions of the auxiliary wiring layer and the lower electrodes can easily be disposed in other than luminescent portions. By carrying out the fourth invention in this way, the level-differences resulting from the film thicknesses of the lower electrodes and the auxiliary wiring layer can be cancelled by the electric insulation layer, so that they can easily be made flat. Therefore, crosstalk and display defects such as generation of non-luminescence lines can be reduced even if the sectional area of the auxiliary wiring layer is made large.

What is claimed is:

1. An organic electroluminescence display device comprising a supporting substrate on which lower electrodes electrically connected to auxiliary wiring layers, an organic luminescent medium, and opposed electrodes are successively disposed, and the lower electrodes and the opposed electrodes are disposed in a XY matrix, wherein
    at least part of the auxiliary wiring layers and the lower electrodes are wired in different planes, between the organic luminescent medium and supporting substrate, and
    the auxiliary wiring layers are electrically connected to the lower electrodes in non-luminescent portions.

2. The organic electroluminescence display device according to claim 1, wherein an electric insulation layer is disposed between the auxiliary wiring layers and the lower electrodes.

3. The organic electroluminescence display device according to claim 1, wherein the auxiliary wiring layers are electrically connected to the lower electrodes through via holes formed in the non-luminescent portions.

4. An organic electroluminescence display device comprising a supporting substrate on which lower electrodes electrically connected to auxiliary wiring layers, an organic luminescent medium, and opposed electrodes are successively disposed, and the lower electrodes and the opposed electrodes are disposed in a XY matrix, wherein
    the auxiliary wiring layers and the lower electrodes are wired in a same plane, and
    the auxiliary wiring layers are electrically connected to the lower electrodes in non-luminescent portions by electric connecting parts provided therein, and
    the electric insulation layer is disposed between the auxiliary wiring layers and the lower electrodes to separate the auxiliary wiring layers and the lower electrodes, except the electric connecting parts.

5. The organic electroluminescence display device according to claim 2, wherein a surface of the electric insulation layer is flattened.

6. The organic electroluminescence display device according to claim 3, wherein side surfaces of the via holes are made into a forward-tapered form.

7. The organic electroluminescence display device according to claim 3, wherein the lower electrodes are extended into the via holes for the electrical connection.

8. A method of producing an organic electroluminescence display device comprising a supporting substrate on which lower electrodes electrically connected to auxiliary wiring layers, an organic luminescent medium, and opposed electrodes are successively disposed, and the lower electrodes and the opposed electrodes are disposed in a XY matrix, the method comprising the steps of:
    wiring at least part of the auxiliary wiring layers and the lower electrodes in different planes between the organic luminescent medium and supporting substrate; and connecting the auxiliary wiring layers electrically to the lower electrodes in non-luminescent portions.

9. The method of producing the organic electroluminescence display device according to claim 8, further comprising the step of disposing an electric insulation layer between the lower electrodes and the auxiliary wiring layers.

10. The method of producing an organic electroluminescence display device according to claim 8, further comprising the steps of:

making via holes in the non-luminescent portions; and connecting the auxiliary wiring layers electrically to the lower electrodes through the via holes.

11. A method of producing an organic electroluminescence display device comprising a supporting substrate on which lower electrodes electrically connected to auxiliary wiring layers, an organic luminescent medium, and opposed electrodes are successively disposed, and the lower electrodes and the opposed electrodes being disposed in a XY matrix, the method comprising the steps of:

wiring the auxiliary wiring layers and the lower electrodes in a same plane forming electrical connecting parts in non-luminescent portions to connect the auxiliary wiring layers electrically to the lower electrodes; and disposing an electric insulation layer between the auxiliary wiring layers and the lower electrodes to separate the auxiliary wiring layers and the lower electrodes, except the electric connecting parts.

12. The method of producing an organic electroluminescence display device according to claim 9, further comprising the step of flattening a surface of the electric insulation layer.

13. The method of producing an organic electroluminescence display device according to claim 10, further comprising the step of making side surfaces of the via holes into a forward-tapered form.

14. The method of producing an organic electroluminescence display device according to claim 10, further comprising the step of extending the lower electrodes into the via holes to connect the lower electrodes electrically to the auxiliary wiring layers.

15. The organic electroluminescence display according to claim 1, wherein the auxiliary wiring layers are arranged only in non-luminescent portions.

16. The organic electroluminescence display device according to claim 4, wherein the auxiliary wiring layers are arranged only in non-luminescent portions.

17. The method of producing an organic electroluminescence display device according to claim 8, wherein the auxiliary wiring layers are arranged only in non-luminescent portions.

18. The method of producing an organic electroluminescence display device according to claim 11, wherein the auxiliary wiring layers are arranged only in non-luminescent portions.

* * * * *